US012581217B2

(12) United States Patent
Park et al.

(10) Patent No.: US 12,581,217 B2
(45) Date of Patent: Mar. 17, 2026

(54) IMAGE SENSOR

(71) Applicant: Samsung Electronics Co., Ltd.,
Suwon-si (KR)

(72) Inventors: Eunji Park, Suwon-si (KR); Jungwook Lim, Suwon-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 153 days.

(21) Appl. No.: 18/390,867

(22) Filed: Dec. 20, 2023

(65) Prior Publication Data

US 2024/0214703 A1     Jun. 27, 2024

(30) Foreign Application Priority Data

Dec. 21, 2022     (KR) ........................ 10-2022-0180891

(51) Int. Cl.
| | |
|---|---|
| *H04N 25/709* | (2023.01) |
| *H04N 25/766* | (2023.01) |
| *H04N 25/77* | (2023.01) |
| *H04N 25/771* | (2023.01) |
| *H10F 39/00* | (2025.01) |
| *H10F 39/18* | (2025.01) |

(52) U.S. Cl.
CPC .......... *H04N 25/709* (2023.01); *H04N 25/77* (2023.01); *H10F 39/8027* (2025.01); *H04N 25/766* (2023.01)

(58) Field of Classification Search
CPC .... H04N 25/709; H04N 25/77; H04N 25/766; H04N 25/29; H04N 25/771; H10F 39/8027; H10F 39/18; H10F 39/802; H10F 39/8037; H10F 39/811; H10F 39/813
See application file for complete search history.

(56) References Cited

U.S. PATENT DOCUMENTS

| | | |
|---|---|---|
| 7,489,352 B2 | 2/2009 | Nakamura |
| 9,578,223 B2 | 2/2017 | Luo et al. |
| 10,009,558 B2 | 6/2018 | Lule et al. |
| 10,014,333 B2 | 7/2018 | Velichko et al. |
| 10,110,839 B2 | 10/2018 | Mlinar et al. |
| 10,397,500 B1 | 8/2019 | Xu et al. |
| 10,411,063 B2 | 9/2019 | Yang et al. |
| 10,498,991 B2 | 12/2019 | Van Der Tempel |

(Continued)

FOREIGN PATENT DOCUMENTS

| | | |
|---|---|---|
| KR | 10-1211085 B1 | 12/2012 |
| KR | 10-2332287 B1 | 11/2021 |

*Primary Examiner* — Marly S Camargo
(74) *Attorney, Agent, or Firm* — HARNESS, DICKEY & PIERCE, P.L.C.

(57) ABSTRACT

An image sensor includes a plurality of pixels, each pixel of the plurality of pixels includes, a first photodiode, a second photodiode, a first transfer transistor connected to a first floating diffusion node, a second transfer transistor connected to a second floating diffusion node, a first reset transistor configured to reset the first floating diffusion node with a first reset power supply voltage, a second reset transistor configured to reset the second floating diffusion node with a second reset power supply voltage, a switch transistor connecting the second floating diffusion node to the first floating diffusion node, and a first driving transistor configured to output an output voltage according to a voltage of the first floating diffusion node.

20 Claims, 15 Drawing Sheets

(56) References Cited

U.S. PATENT DOCUMENTS

| | | | |
|---|---|---|---|
| 10,714,517 B2 | 7/2020 | Lee et al. | |
| 10,734,420 B2 | 8/2020 | Kim | |
| 10,939,094 B2 | 3/2021 | Chua et al. | |
| 11,189,651 B2 | 11/2021 | Lee et al. | |
| 11,350,044 B2 | 5/2022 | Mori et al. | |
| 11,658,193 B2 * | 5/2023 | Lee | H04N 25/778 |
| 12,185,004 B2 * | 12/2024 | Choi | H10K 39/32 |
| 2019/0131326 A1 * | 5/2019 | Kim | H10F 39/014 |
| 2020/0235152 A1 * | 7/2020 | Lee | H10F 39/807 |
| 2022/0059588 A1 * | 2/2022 | Lee | H04N 25/778 |
| 2022/0217291 A1 | 7/2022 | Kim et al. | |
| 2023/0134685 A1 * | 5/2023 | Lim | H04N 25/772 |
| 2023/0299099 A1 * | 9/2023 | Lim | H10F 39/8033 |

* cited by examiner

IMAGE SENSOR

CROSS-REFERENCE TO RELATED APPLICATION

This application is based on and claims priority under 35 U.S.C. § 119 to Korean Patent Application No. 10-2022-0180891, filed on Dec. 21, 2022, in the Korean Intellectual Property Office, the disclosure of which is incorporated by reference herein in its entirety.

BACKGROUND

Various example embodiments relate to image sensors, and more particularly, to image sensors including a split-photodiode (split-PD) pixel to which a reset transistor or a driving transistor is added and image sensors including a plurality of current sources.

Image sensors are used to capture 2D or 3D images of objects. Image sensors generate images of objects by using photoelectric conversion elements that react according to the intensity of light reflected from the objects. Owing to the recent development of the complementary metal-oxide semiconductor (CMOS) technology, CMOS image sensors using CMOS are widely used. According to a split photo-diode (split-PD) technique developed to increase the dynamic range of image sensors, a plurality of photodiodes having different light-receiving areas are included in one pixel. Thus, research into obtaining an image signal from a plurality of photodiodes included in a split photodiode without deterioration is required.

SUMMARY

Various example embodiments provide image sensors and pixels for processing a reset signal and a pixel signal obtained from each of a plurality of photodiodes of a split-photodiode structure without image quality deterioration.

According to various example embodiments, there is provided an image sensor including a plurality of pixels. Each pixel of the plurality of pixels includes a first photodiode, a second photodiode adjacent to the first photodiode and having a smaller light-receiving area than a light-receiving area of the first photodiode, a first transfer transistor having an end connected to the first photodiode and another end connected to a first floating diffusion node, a second transfer transistor having an end connected to the second photodiode and another end connected to a second floating diffusion node, a first reset transistor having an end connected to a first reset power supply voltage and configured to reset the first floating diffusion node with the first reset power supply voltage, a second reset transistor having an end connected to a second reset power supply voltage and configured to reset the second floating diffusion node with the second reset power supply voltage, a switch transistor having an end connected to the second reset transistor and connecting the second floating diffusion node to the first floating diffusion node, and a first driving transistor configured to output an output voltage according to a voltage of the first floating diffusion node.

Alternatively or additionally, according to various example embodiments, there is provided an image sensor including a pixel configured to output a pixel signal through a first column line. The pixel includes a first photodiode provided in a first pixel region, a second photodiode provided in a second pixel region, the second pixel region having an area smaller than an area of the first pixel region and provided adjacent to the first pixel region, a first reset transistor provided in the first pixel region, the first reset transistor having an end connected to a reset power supply voltage and configured to reset a first floating diffusion node, a first driving transistor provided in the first pixel region and having a gate connected to the first floating diffusion node, a first selection transistor provided in the first pixel region and having an end connected to the first driving transistor, a second reset transistor having an end connected to the reset power supply voltage and configured to reset a second floating diffusion node, a second driving transistor provided in the first pixel region and having a gate connected to the second floating diffusion node, and a second selection transistor provided in the first pixel region and having an end connected to the second driving transistor, wherein another end of the first selection transistor and another end of the second selection transistor are connected to the first column line.

Alternatively or additionally, according to various example embodiments, there is provided an image sensor including a pixel configured to output pixel signals through a first column line and a second column line. The pixel includes a first photodiode provided in a first pixel region, a second photodiode provided in a second pixel region, the second pixel region having an area smaller than an area of the first pixel region and provided adjacent to the first pixel region, a first reset transistor provided in the first pixel region, the first reset transistor having an end connected to a reset power supply voltage and configured to reset a first floating diffusion node with the reset power supply voltage, a first transfer transistor provided in the first pixel region, the first transfer transistor having an end connected to the first photodiode and another end connected to the first floating diffusion node, a first driving transistor provided in the first pixel region and having a gate connected to the first floating diffusion node, a first selection transistor provided in the first pixel region and having an end connected to the first driving transistor, a second driving transistor provided in the first pixel region and having a gate connected to a second floating diffusion node, a second selection transistor provided in the first pixel region and having an end connected to the second driving transistor, a second transfer transistor provided in the second pixel region, the second transfer transistor having an end connected to the second photodiode and another end connected to the second floating diffusion node, and a second reset transistor having an end connected to the reset power supply voltage and configured to reset the second floating diffusion node with the reset power supply voltage, wherein another end of the first selection transistor is connected to the first column line, and another end of the second selection transistor is connected to the second column line.

BRIEF DESCRIPTION OF THE DRAWINGS

Example embodiments will be more clearly understood from the following detailed description taken in conjunction with the accompanying drawings in which:

FIG. 1 is a block diagram illustrating an image sensor according to example embodiments;

FIGS. 6A and 6B are circuit diagrams illustrating pixels according to some example embodiments;

DETAILED DESCRIPTION

Figure 2A:
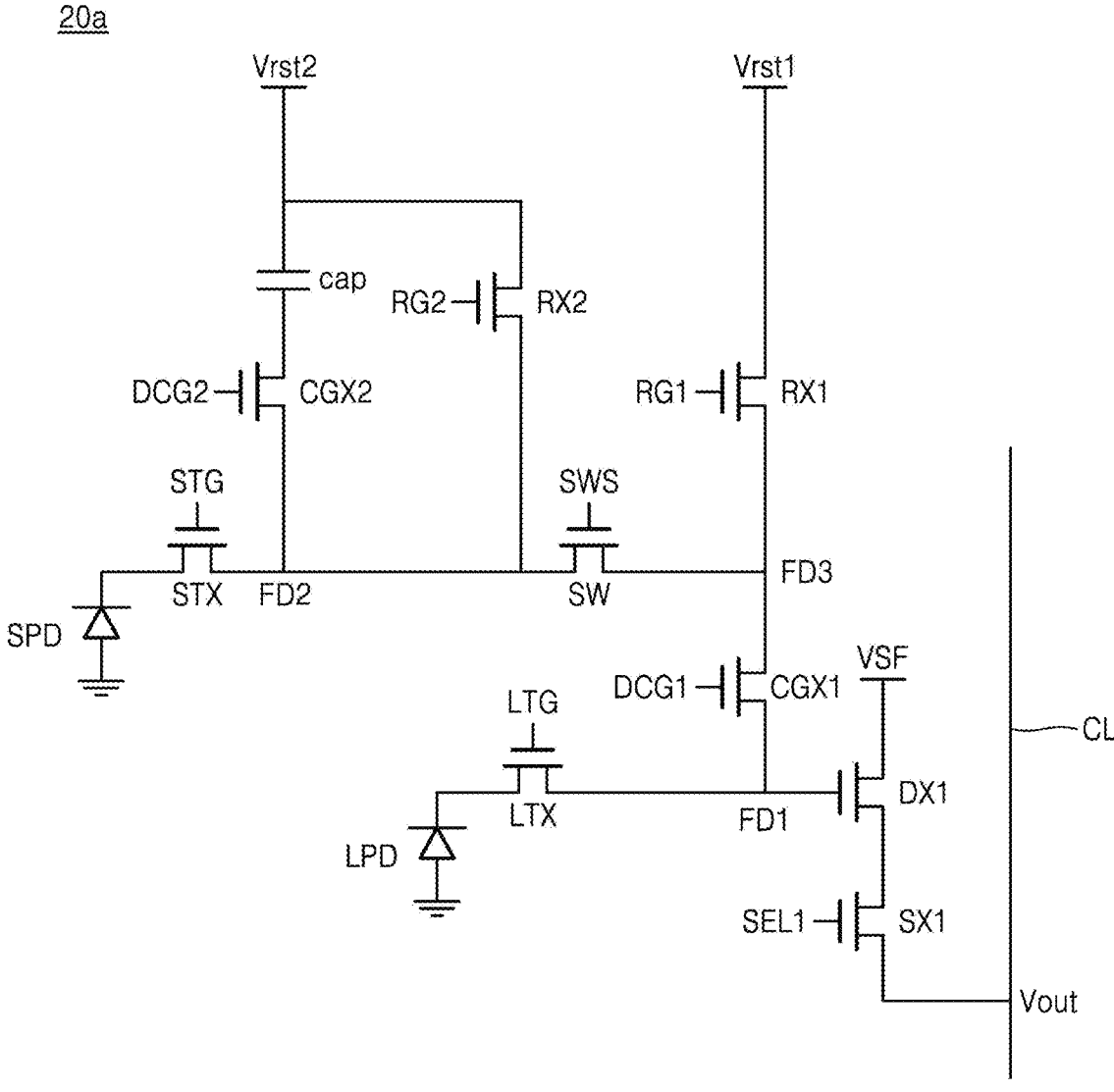
FIGS. 2A and 2B are circuit diagrams illustrating pixels according to example embodiments.

Hereinafter, some example embodiments will be described with reference to the accompanying drawings.

Figure 1:
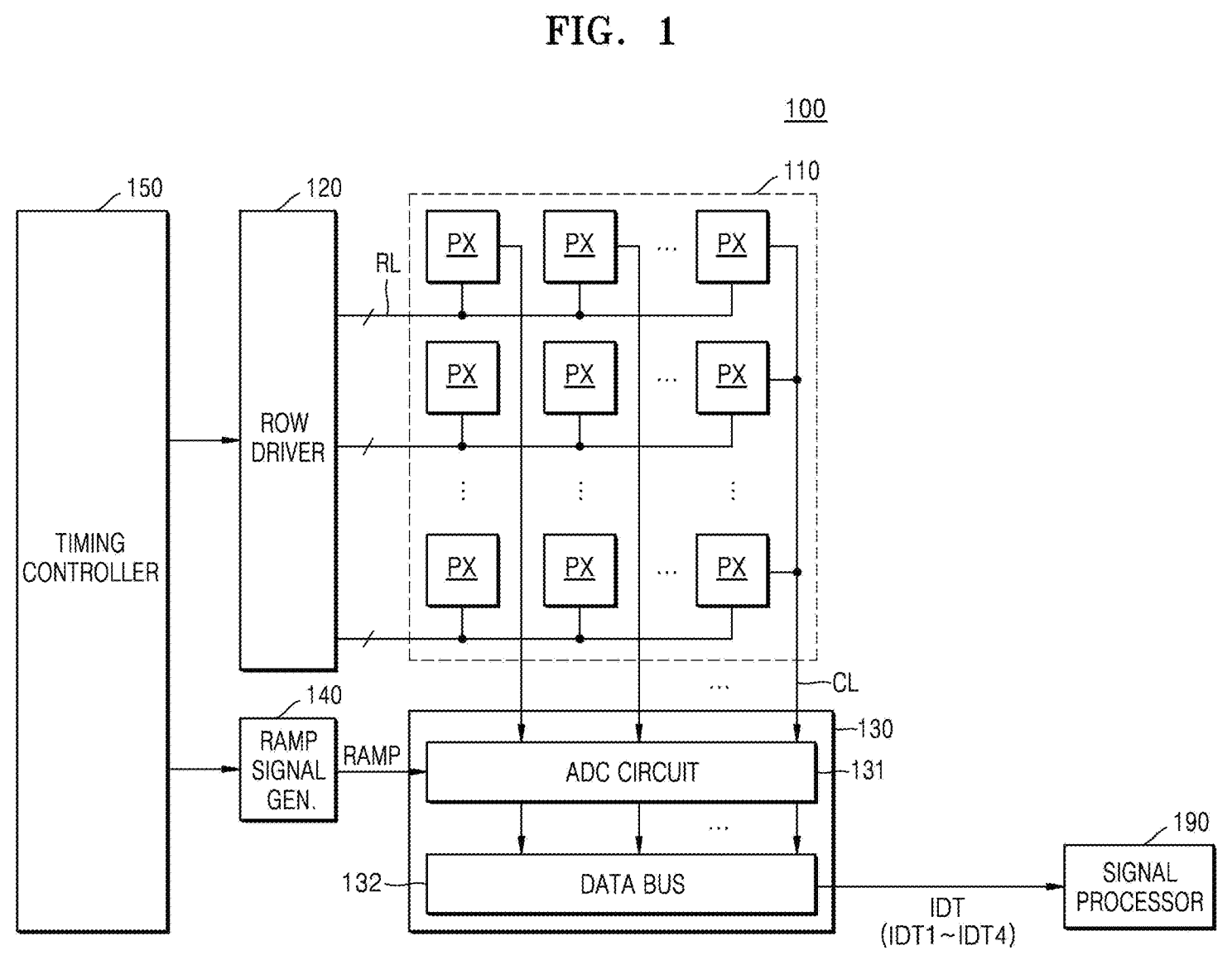

FIG. 1 is a block diagram illustrating an image sensor 100 according to some example embodiments.

The image sensor 100 may be mounted on an electronic device having an image or light sensing function. For example, the image sensor 100 may be mounted on an electronic device such as a camera, a smartphone, a wearable device, an Internet of things (IOT) device, a home appliance, a tablet personal computer (PC), a personal digital assistant (PDA), a portable multimedia player (PMP), a navigation system, a drone, or an advanced driver assistance system (ADAS). In addition, the image sensor 100 may be mounted on an electronic device that is provided as a component in vehicles, furniture, manufacturing facilities, doors, measuring devices, or the like.

Referring to FIG. 1, some example embodiments of the image sensor 100 may include a pixel array 110, a row driver 120, a readout circuit 130, a ramp signal generator 140, a timing controller 150, and a signal processor 190. The readout circuit 130 may include an analog-to-digital converter (ADC) circuit 131, and a data bus 132.

The pixel array 110 may include a plurality of pixels PX arranged in a matrix. The pixels PX may be connected to a plurality of row lines RL and a plurality of column lines CL. For example, each of the row lines RL may extend in a row direction and may be connected to pixels PX arranged in the same row. A number of row lines may be the same as, greater than, or less than a number of column lines CL. However, unlike the pixels PX shown in FIG. 1, pixels PX arranged in the same row may be connected to different row lines RL. Each of the pixels PX may receive a control signal from the row driver 120 through a row line R to which the pixel PX is connected.

According to some example embodiment, each of the pixels PX may include at least one photoelectric conversion element (or referred to as a photo-sensing element). The photoelectric conversion element may sense light and convert the sensed light into photocharges. For example, the photoelectric conversion element may be a photo-sensing element including one or more of an organic material and/or an inorganic material, such as an inorganic photodiode, an organic photodiode, a perovskite photodiode, a phototransistor, a photo gate, or a pinned photodiode. In some example embodiments, each of the pixels PX may include a plurality of photoelectric conversion elements (hereinafter, referred to as photodiodes). A photodiode may generate a plurality of photocharges in response to an amount (e.g., a desired or predetermined amount) of light exposure time. Such plurality of photocharges may be referred to as a photocharge packet.

In addition, a micro-lens (not shown in FIG. 1) for condensing light may be arranged above each of the pixels PX or above each group of adjacent pixels PX. Each of the pixels PX may detect light in a certain spectral range from light received through the micro-lens. For example, the pixel array 110 may include a red pixel configured to convert light in a red spectral range into an electrical signal, a green pixel configured to convert light in a green spectral range into an electrical signal, and a blue pixel configured to convert light in a blue spectral range into an electrical signal. A color filter configured to transmit light in a certain spectral range may be arranged on each of the pixels PX. However, embodiments are not limited thereto, and the pixel array 110 may include pixels configured to convert light into electrical signals from spectral ranges other than red, green, and blue spectral ranges.

In some example embodiments, each of the pixels PX may have a multi-layer structure. In this case, each of the pixels PX may include a plurality of stacked photodiodes that convert light in different spectral ranges into electrical signals, and thus electrical signals corresponding to different colors may be generated by the photodiodes. In other words, electrical signals corresponding to a plurality of colors may be output from one pixel PX.

In some example embodiments, each of the pixels PX may have a split photodiode (split PD) structure including at least two photodiodes configured to be exposed to light, and the at least two photodiodes may be exposed or reset independently of each other. For example, the pixels PX may include a large photodiode (hereinafter also referred to as an LPD or a first photodiode) having a relatively large light-receiving area, and a small photodiode (hereinafter also referred to as an SPD or a second photodiode) having a relatively small light-receiving area.

In some example embodiments, the pixels PX of the pixel array 110 may operate in a dual conversion gain mode. The dual conversion gain mode will be described later with reference to FIG. 2A.

Each of the column lines CL may extend in a column direction and may be connected to pixels PX arranged in the same column. However, unlike the pixels PX shown in FIG. 1, pixels PX arranged in the same column may be connected to different column lines CL. Each of the column lines CL may transmit reset signals and pixel signals of the pixels PX to the readout circuit 130 in units of rows of the pixel array 110.

The timing controller 150 may control the timing of the row driver 120, the readout circuit 130, and/or the ramp signal generator 140. The timing controller 150 may provide timing signals indicating operation timings respectively to the row driver 120, the readout circuit 130, and/or the ramp signal generator 140.

The row driver 120 may generate control signals for driving the pixel array 110 under control by the timing controller 150 and may provide the control signals to the pixels PX of the pixel array 110 through the row lines RL. Turn-on and turn-off operations of transistors (described later) may be performed using control signals provided from the row driver 120. For example, a first transfer transistor LTX (refer to FIG. 2A) may be turned on in response to a first transfer control signal LTG having an active (logic-high) level and may be turned off in response to a first transfer control signal LTG having an inactive (logic-low) level. How the pixels PX operate according to control signals provided from the row driver 120 will be described later with reference to FIG. 2A.

The row driver 120 may control the pixels PX of the pixel array 110 to sense incident light simultaneously or in units of rows. In addition, the row driver 120 may select pixels PX in units of rows from the pixels PX, and may control the selected pixels PX (for example, pixels PX in one row) to output (generate) reset signals and pixel signals through the column lines CL.

The readout circuit 130 may read out reset signals and pixel signals from pixels PX of a row selected by the row driver 120 from among the pixels PX. The readout circuit 130 may convert reset signals and pixel signals received from the pixel array 110 through the column lines CL into digital data by using a ramp signal RAMP received from the ramp signal generator 140. The readout circuit 130 may thereby generate and output pixel values (image signals) corresponding to the pixels PX in units of rows.

The ADC circuit 131 may include a plurality of ADCs respectively corresponding to the column lines CL. For example, each of the ADCs may compare a ramp signal RAMP with reset signals and pixel signals that are received through a corresponding column line CL, and may generate pixel values based on results of the comparison. For example, each of the ADCs may remove a reset signal from a pixel signal and may generate a pixel value indicating the amount of light sensed by a pixel PX. For example, each of the ADCs may generate an image signal (first image signal) based on an LPD-H reset signal and an LPD-H pixel signal in an LPD-H mode. Each of the ADCs may also generate an image signal (second image signal) based on an LPD-L reset signal and an LPD-L pixel signal in an LPD-L mode (described later with reference to FIG. 2A). Additionally or alternatively, each of the ADCs may generate an image signal (third image signal) based on an SPD-H reset signal and an SPD-H pixel signal in an SPD-H mode. Each of the ADCs may generate an image signal (fourth image signal) based on an SPD-L reset signal and an SPD-L pixel signal in an SPD-L mode.

A plurality of image signals generated by the ADC circuit 131 may be output as image data IDT through the data bus 132. For example, the image data IDT may be provided to an image signal processor or signal processor 190 provided inside or outside the image sensor 100.

The data bus 132 may store, e.g. temporarily store, pixel values (image signals) output from the ADC circuit 131 and may then output the temporarily stored pixel values. The data bus 132 may include a plurality of column memories and a column decoder. A plurality of pixel values stored in the column memories may be output as image data IDT under control by the column decoder. For example, the data bus 132 may output a first image signal as a first piece of image data IDT1, a second image signal as a second piece of image data IDT2, a third image signal as a third piece of image data IDT3, and a fourth image signal as a fourth piece of image data IDT4.

The signal processor 190 may perform one or more of noise reduction processing, gain adjustment, waveform shaping processing, interpolation processing, white balance processing, gamma processing, edge enhancement processing, binning, and/or the like on image data. In some example embodiments, during one frame period, the pixel array 100 may operate in an LPD-H mode, an LPD-L mode, an SPD-H mode, and/or an SPD-L mode (described later with reference to FIG. 2A). Therefore, the signal processor 190 may receive, from the data bus 132, a first piece of image data in the LPD-H mode, a second piece of image data in the LPD-L mode, a third piece of image data in the SPD-H mode, and a fourth piece of image data in the SPD-L mode and may generate a HDR image by merging the first to fourth pieces of image data. In an example embodiment, the signal processor 190 may be provided in a processor outside the image sensor 100.

Figure 2B:
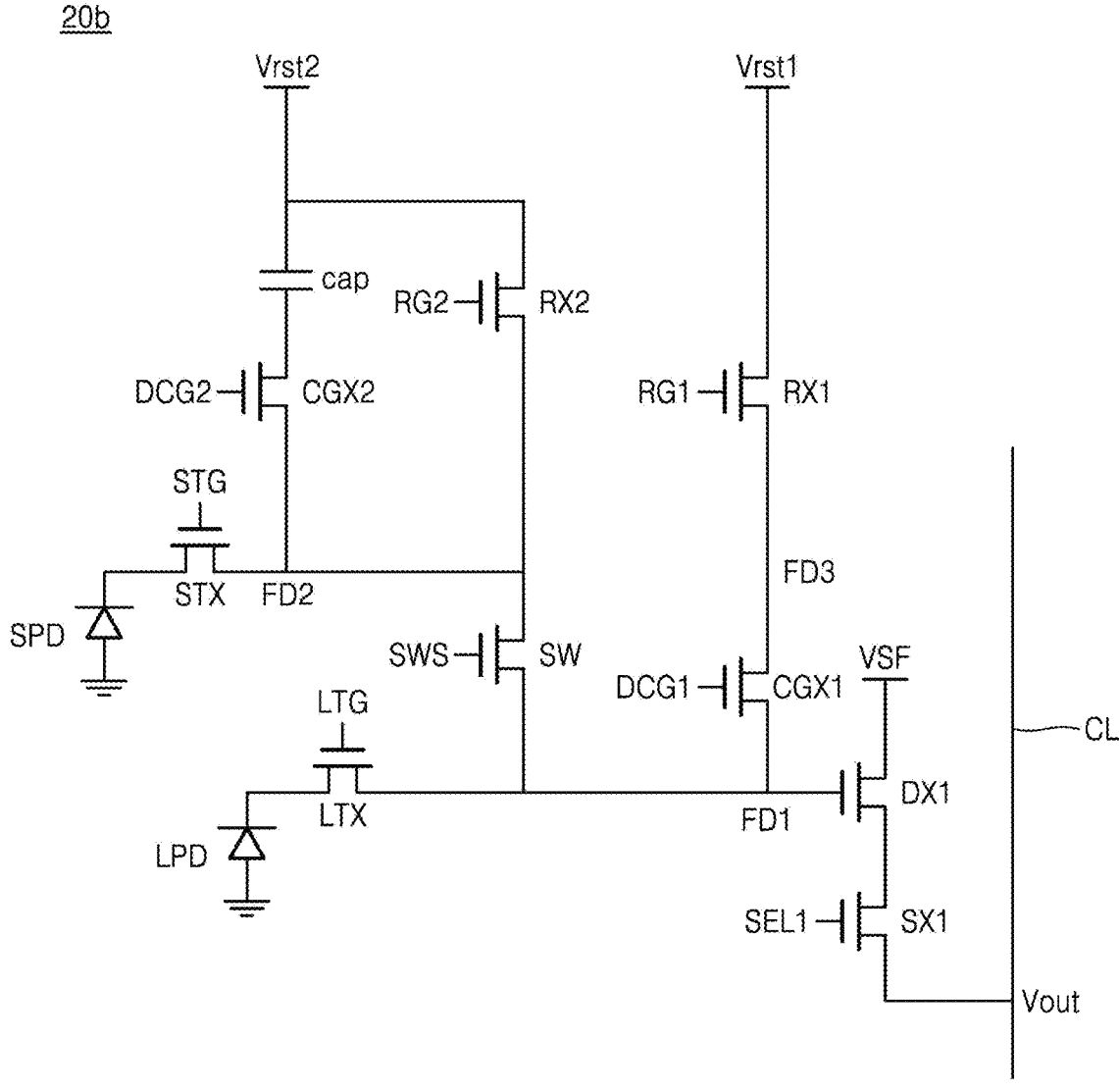

FIGS. 2A and 2B are circuit diagrams respectively illustrating a pixel 20a and a pixel 20b according to some example embodiments.

Referring to FIGS. 2A and 2B, each of the pixel 20a shown in FIG. 2A and the pixel 20b shown in FIG. 2B may further include a second reset transistor RX2 compared to a pixel 30 described later with reference to FIG. 3. An end of the second reset transistor RX2 may be connected to a second reset power supply voltage Vrst2 having a voltage level that is different from a voltage level of a first reset power supply voltage Vrst1.

Each of the example embodiments of pixels 20a and 20b shown in FIGS. 2A and 2B may include a plurality of photodiodes and a plurality of transistors. For example, each of the pixels 20a and 20b may include a first photodiode LPD, a second photodiode SPD, a first transfer transistor LTX, a second transfer transistor STX, a first reset transistor RX1, the second reset transistor RX2, a first driving transistor DX1, a first selection transistor SX1, a first conversion gain transistor CGX1, a second conversion gain transistor CGX2, a switch transistor SW, and a capacitor cap.

As described above, the first photodiode LPD may have a relatively large light-receiving area, and the second photodiode SPD may have a light-receiving area that is smaller than the light-receiving area of the first photodiode LPD. The greater the light-receiving area of a photodiode, the more the photodiode may be exposed to incident light. Therefore, the first photodiode LPD having a relatively large light-receiving area may be used in a dark environment.

The first reset power supply voltage Vrst1, the second reset power supply voltage Vrst2, and a driving voltage VSF may be applied to the pixels 20a and 20b. The first reset power supply voltage Vrst1 may be greater than the second reset power supply voltage Vrst2. The first reset power supply voltage Vrst1 may be connected to an end of the first reset transistor RX1, and the second reset power supply voltage Vrst2 may be connected to an end of the second reset transistor RX2. The driving voltage VSF may be connected to an end of the first driving transistor DX1, and thus the first driving transistor DX1 may output, through the selection transistor SX1, a voltage corresponding to a photocharge packet accumulated in a first floating diffusion node FD1. The driving voltage VSF may be the same as the first reset power supply voltage Vrst1, but is not limited thereto.

The first photodiode LPD and the second photodiode SPD may convert light incident from the outside into electrical signals. Photodiodes are a type of device configured to generate an electrical charge according to the intensity of light. The amounts of charge generated by the first photodiode LPD and the second photodiode SPD vary according to an image capturing environment (low or high illumination). For example, the amount of charge generated in the first photodiode LPD may reach the full well capacity (FWC) of the first photodiode LPD in a high-illumination environment, but may not reach the FWC of the first photodiode LPD in a low-illumination environment.

Photocharges generated in the first photodiode LPD in response to incident light may be referred to as a first photocharge packet, and photocharges generated in the second photodiode SPD in response to incident light may be referred to as a second photocharge packet.

The first driving transistor DX1 may operate as a source follower, and may output a voltage corresponding to a photocharge packet accumulated in the first floating diffusion node FD1 to a column line CL through the selection transistor SX1 as an output voltage Vout.

The first selection transistor SX1 may be used to select a pixel PX that will output an output voltage Vout. The first selection transistor SX1 may be turned on in response to a first selection control signal SEL1 having an active level and applied to a gate of the first selection transistor SX1, and the output voltage Vout (or current) output from the first driving transistor DX1 may be output to the column line CL through the first selection transistor SX1. The output voltage Vout may be provided to the ADC circuit 131 (refer to FIG. 1) through the column line CL.

Capacitors, for example, parasitic capacitors, may be formed at first to third floating diffusion nodes FD1, FD2, and FD3. The capacitor cap may be a passive element having a fixed or variable capacitance or the capacitor cap may be used for adjusting the capacitance of the second floating diffusion node FD2.

As described above, the pixels 20a and 20b may operate in a dual conversion gain mode. The dual conversion gain mode includes a low conversion gain (LCG) mode and a high conversion gain (HCG) mode. Herein, the term "conversion gain" (the unit of the conversion gain may be, for example, u V/e) may refer to the ratio of a voltage obtained by converting a photocharge packet accumulated in the first floating diffusion node FD1 to the photocharge packet accumulated in the first floating diffusion node FD1. Photocharge packets respectively generated in the first photodiode LPD and the second photodiode SPD may be transferred to and accumulated in the first floating diffusion node FD1, and an output voltage Vout may be output based on a voltage corresponding to the photocharge packets accumulated in the first floating diffusion node FD1. In this case, the conversion gain may vary according to the capacitance of the first floating diffusion node FD1. Additionally, according to variations in the conversion gain, different output voltages Vout may be obtained with respect to the same photocharge packet. An increase in the capacitance of the first floating diffusion node FD1 may decrease the conversion gain, and a decrease in the capacitance of the first floating diffusion node FD1 may increase the conversion gain.

According to operations of the transistors, the first floating diffusion node FD1 may be connected to the second floating diffusion node FD2 and/or the third floating diffusion node FD3. The capacitance of the capacitor formed at the first floating diffusion node FD1 may vary according to whether the first floating diffusion node FD1 is connected to the second floating diffusion node FD2 and/or the third floating diffusion node FD3. For example, when the first conversion gain transistor CGX1 is turned on and the first floating diffusion node FD1 and the third floating diffusion node FD3 are connected to each other, the capacitors of the first floating diffusion node FD1 and the third floating diffusion node FD3 may be connected to each other, increasing the capacitance of the capacitor of the first floating diffusion node FD1. In this case, the pixels 20a and 20b may operate in the LCG mode.

Among the first photodiode LPD and the second photodiode SPD, the first photodiode LPD may operate in the HCG mode (LPD-H mode) during a lowest illuminance period (first illuminance period), and in the LCG mode (LPD-L mode) during an illumination period (second illumination period) having more illumination than the first illumination period. The second photodiode SPD may operate in the HCG mode (SPD-H mode) during an illuminance period (third illumination period) having more illumination than the second illumination period, and in the LCG mode (SPD-L mode) during an illumination period (fourth illumination period) having more illumination than the third illumination period. Each of the pixels 20a and 20b may include a high-capacity capacitor cap configured to be connected to the second photodiode SPD to decrease the conversion gain when the exposure time is long in the fourth illuminance period.

As described above, the first photodiode LPD and the second photodiode SPD of each of the pixels 20a and 20b may operate in the HCG mode and the LCG mode, thereby guaranteeing an HDR.

For example, a first piece of image data generated as the first photodiodes LPD of the pixels PX of the pixel array 110 operate in the HCG mode may be used to generate an image for the first illumination period (darkest region), and a second piece of image data generated as the first photodiodes LPD of the pixels PX of the pixel array 110 operate in the LCG mode may be used to generate an image for the second illumination period (region brighter than in the first illumination period). A third piece of image data generated as the second photodiodes SPD of the pixels PX of the pixel array 110 operate in the HCG mode may be used to generate an image for the third illumination period (region brighter than in the second illumination period but darker than in the fourth illumination period described later), and a fourth piece of image data generated as the second photodiodes SPD of the pixels PX of the pixel array 110 operate in the LCG mode may be used to generate an image for the fourth illumination period (brightest region).

According to some example embodiments, in one frame in which the pixel array 110 is scanned, a readout period of each of the pixels 20a and 20b, including the first photodiode LPD and the second photodiode SPD, may include an LPD readout period and an SPD readout period. In the LPD readout period, the output voltage Vout of each of the pixels 20a and 20b may be read out based on a first photocharge packet generated in the first photodiode LPD in the LPD-H mode and the LPD-L mode, and in the SPD readout period, the output voltage Vout of each of the pixels 20a and 20b may be read out based on a second photocharge packet generated in the second photodiode SPD in the SPD-H mode and the SPD-L mode.

For example, the output voltage Vout of each of the pixels 20a and 20b may be read out continuously in the order of the LPD-H mode, the LPD-L mode, the SPD-H mode, and the SPD-L mode, and thus first to fourth pieces of image data may be generated as described above in one frame period. A HDR 1-shot image in which bright regions (high-illumination regions) and dark regions (low-illumination regions) are clearly expressed may be generated by merging the first to fourth pieces of image data with each other.

As described above, in the LPD readout period, the first photodiode LPD may operate in the LPD-H mode and the LPD-L mode. In the LPD-H mode, the first photodiode LPD may generate a reset signal (LPD-H reset signal) and a pixel signal (LPD-H pixel signal), and in the LPD-L mode, the first photodiode LPD may generate a reset signal (LPD-L reset signal) and a pixel signal (LPD-L pixel signal). In addition, in the SPD readout period, the second photodiode SPD may operate in the SPD-H mode and the SPD-L mode. In the SPD-H mode, the second photodiode SPD may generate a reset signal (SPD-H reset signal) and a pixel signal (SPD-H pixel signal), and in the SPD-L mode, the second photodiode SPD may generate a reset signal (SPD-L reset signal) and a pixel signal (SPD-L pixel signal).

The voltage of the first floating diffusion node FD1 when a reset signal is read out may be referred to as a reset level, and the voltage of the first floating diffusion node FD1 when a pixel signal is read out may be referred to as a pixel level. Therefore, the LPD-H reset signal, the LPD-L reset signal, the SPD-H reset signal, and the SPD-L reset signal may be generated respectively based on an LPD-H reset level, an LPD-L reset level, an SPD-H reset level, and an SPD-L reset level. Similarly, the LPD-H pixel signal, the LPD-L pixel signal, the SPD-H pixel signal, and the SPD-L pixel signal may be generated respectively based on an LPD-H pixel level, an LPD-L pixel level, an SPD-H pixel level, and an SPD-L pixel level.

Reading out a first photocharge packet may refer to reading out a reset signal and a pixel signal in each of the LPD-H mode and the LPD-L mode. Similarly, reading out a second photocharge packet may refer to reading out a reset signal and a pixel signal in each of the SPD-H mode and the SPD-L mode.

In some example embodiments depicted in FIGS. 2A and 2B, the first reset power supply voltage Vrst1 may be greater than the second reset power supply voltage Vrst2. The first floating diffusion node FD1 and the third floating diffusion node FD3 may be reset by the first reset power supply voltage Vrst1, and the second floating diffusion node FD2 may be reset by the second reset power supply voltage Vrst2. Image quality deterioration caused by the difference between the LPD-H reset level and the SPD-H reset level, which will be described later with reference to FIGS. 3 and 4, may be prevented or reduced based on the voltage difference between the first reset power supply voltage Vrst1 and the second reset power supply voltage Vrst2.

The switch transistor SW of the pixel 20a may be provided between the second floating diffusion node FD2 and the third floating diffusion node FD3, and the switch transistor SW of the pixel 20b may be provided between the first floating diffusion node FD1 and the second floating diffusion node FD2. Therefore, in the pixel 20a, when the switch transistor SW is turned on by a switch control signal SWS having an active level and applied to the switch transistor SW, the second floating diffusion node FD2 and the third floating diffusion node FD3 may be connected to each other. In the pixel 20b, when the switch transistor SW is turned on by a switch control signal SWS having an active level and applied to the switch transistor SW, the second floating diffusion node FD2 and the first floating diffusion node FD1 may be connected to each other.

In some example embodiments, the LPD-H reset signal, the LPD-H pixel signal, the LPD-L pixel signal, the LPD-L reset signal, the SPD-H reset signal, the SPD-H pixel signal, the SPD-L pixel signal, and the SPD-L reset signal may be sequentially read out with respect to the first photocharge packet and the second photocharge packet generated in the pixels 20a and 20b.

Figure 3:
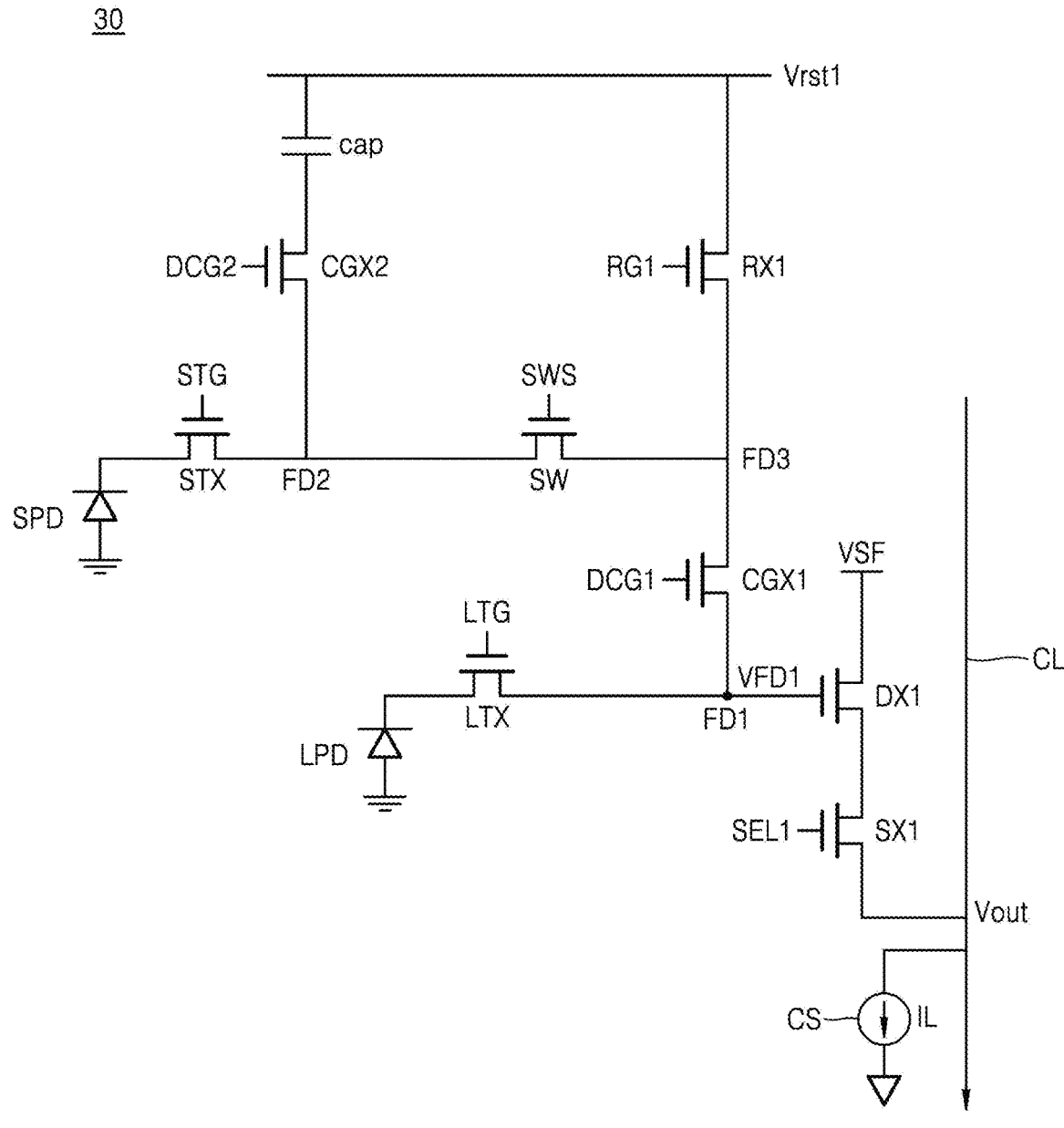
FIG. 3 is a circuit diagram illustrating an implementation of a pixel according to some example embodiments.

FIG. 3 is a circuit diagram illustrating the pixel 30 implemented according to a comparative example embodiments.

FIG. 3 may be described with reference to the description of FIG. 2A, and repeating descriptions may be omitted.

Unlike the pixels 20a and 20b described with reference to FIGS. 2A and 2B, the pixel 30 shown in FIG. 3 may not include a second reset transistor RX2.

A first driving transistor DX1 may operate as a source follower based on a bias current IL generated by a current source CS connected to a column line CL. Although the current source CS and the bias current IL are omitted in FIGS. 2A and 2B, the same may be used in each of the pixels 20a and 20b shown in FIGS. 2A and 2B.

Before reading out each of a first photocharge packet and a second photocharge packet generated in a first photodiode LPD and a second photodiode SPD of the pixel 30, a first floating diffusion node FD1, a second floating diffusion node FD2, and a third floating diffusion node FD3 may be reset. In this case, unlike in the pixels 20a and 20b, all the first, second, and third floating diffusion nodes FD1, FD2, and FD3 of the pixel 30 may be reset by a first reset power supply voltage Vrst1.

For example, when the first reset power supply voltage Vrst1 is 2.8 V, a first reset transistor RX1 is turned on by first reset control signal RG1, a first conversion gain transistor CGX1 is turned on by a first gain control signal DCG1, and a switch transistor SW is turned on by a switch control signal SWS, the first reset control signal RG1, first gain control signal DCG1, and switch control signal SWS having active levels and are provided by the row driver 120, the first floating diffusion node FD1, the second floating diffusion node FD2, and the third floating diffusion node FD3 may be reset by the first reset power supply voltage Vrst1. Therefore, the voltages of the first floating diffusion node FD1, the second floating diffusion node FD2, and the third floating diffusion node FD3 may be 2.8 V equal to the first reset power supply voltage Vrst1. Thereafter, to read out the photocharge packet (first photocharge packet) generated by the first photodiode LPD, that is, to generate an LPD-H reset signal, the row driver 120 may provide the first reset control signal RG1, the first gain control signal DCG1, and the switch control signal SWS having inactive levels (logic-low levels), and the first reset transistor RX1, the first conversion gain transistor CGX1, and the switch transistor SW may be turned off. After the first reset transistor RX1 and the first conversion gain transistor CGX1 transit from a turn-on state to a turn-off state, there may be a voltage difference between ends of the first reset transistor RX1 and between ends of the first conversion gain transistor CGX1. A voltage difference between ends of the first reset transistor RX1 and between ends of the first conversion gain transistor CGX1 may exist because of a capacitance difference between the ends of the first reset transistor RX1 and between the ends of the first conversion gain transistor CGX1. Among the ends of the first reset transistor RX1 and the ends of the first conversion gain transistor CGX1, an end having a relatively greater capacitance may have a relatively greater voltage drop.

A gate, a drain, and a source of each of the transistors included in each of the pixels 20a, 20b, and 30 may not be electrically connected to each other. Therefore, the gate, the drain, and the source may have different voltages. In this case, there may be capacitance between the gate and the source, and capacitance between the gate and the drain. That is, there may be capacitance between ends of a transistor. Different capacitances may be formed between ends of transistors because of factors such as operations of the transistors (the direction in which current flows) or process conditions. When a transistor transits from a turned-on state to a turned-off state or from a turn-on state to a turn-off state, a gate voltage of the transistor may vary, and thus there may be a voltage difference between ends of the transistor according to the capacitance between the ends of the transistor.

For example, because of a capacitance difference between ends of the first reset transistor RX1 and between ends of the first conversion gain transistor CGX1, the first floating diffusion node FD1 and the third floating diffusion node FD3 may have voltages less than the first reset power supply voltage Vrst1. Capacitance at an end of the first reset transistor RX1 connected to the third floating diffusion node FD3 may be greater than capacitance at another other end of the first reset transistor RX1 connected to the first reset power supply voltage Vrst1, and capacitance at an end of the first conversion gain transistor CGX1 connected to the first floating diffusion node FD1 may be greater than capacitance at another end of the first conversion gain transistor CGX1 connected to the third floating diffusion node FD3. Therefore, voltages of the first floating diffusion node FD1 and the third floating diffusion node FD3 may be less than the first reset power supply voltage Vrst1.

The phenomenon in which a voltage difference occurs due to a capacitance difference between ends of a transistor is called "clock feedthrough," and due to the clock feedthrough phenomenon, the LPD-H reset level may be less than the first reset power supply voltage Vrst1.

For example, as described above, when the first conversion gain transistor CGX1 and the first reset transistor RX1 are turned on in response to the first gain control signal DCG1 and the first reset control signal RG1 in a state in which the first reset power supply voltage Vrst1 is 2.8 V, the first floating diffusion node FD1 and the third floating diffusion node FD3 may have the same voltage as the first reset power supply voltage Vrst1, that is, 2.8 V. Thereafter, when the first reset transistor RX1 and the first conversion gain transistor CGX1 are turned off from the turn-on state to generate an LPD-H reset signal, the voltage of the third floating diffusion node FD3 may be 2.5 V that is less than the first reset power supply voltage Vrst1 because of the clock feed-through phenomenon caused by a capacitance difference between ends of the first reset transistor RX1. Additionally, the voltage of the first floating diffusion node FD1 may be 2.2 V that is less than the voltage of the third floating diffusion node FD3 because of the clock feedthrough phenomenon caused by a capacitance difference between ends of the first conversion gain transistor CGX1. For example, the LPD-H reset level may be 2.2 V.

Thereafter, when the switch transistor SW is turned on from a turned-off state by applying the switch control signal SWS having an active level to the switch transistor SW to generate a reset signal in the SPD-H mode (in a state in which the second conversion gain transistor CGX2 is turned off), the voltage of the second floating diffusion node FD2 may be greater than the voltage of the third floating diffusion node FD3 because of the clock feedthrough phenomenon caused by a capacitance difference between ends of the switch transistor SW. Here, capacitance at an end of the switch transistor SW connected to the second floating diffusion node FD2 may be less than capacitance at another end of the switch transistor SW.

Therefore, when the first conversion gain transistor CGX1 is maintained in a turned-on state, the first reset transistor RX1 is turned off from a turn-on state, and the switch transistor SW is turned-on from a turn-off state to generate a reset signal in the SPD-H mode (in a state in which the second conversion gain transistor CGX2 is turned off), the voltage of the third floating diffusion node FD3 may be 2.5 V that is less than the first reset power supply voltage Vrst1 (2.8 V) because of a capacitance difference between ends of the first reset transistor RX1 as described above, and the voltage of the second floating diffusion node FD2 may be 2.7 V that is greater than the voltage of the third floating diffusion node FD3 because of a capacitance difference between both ends of the switch transistor SW. Because the first conversion gain transistor CGX1 is in a turned-on state, the voltage of the first floating diffusion node FD1 may be 2.7 V. For example, the SPD-H reset level may be 2.7 V.

Therefore, there may be a difference between the LPD-H reset level and the SPD-H reset level because of the clock feedthrough phenomenon. For example, the LPD-H reset level may be 2.2 V, the SPD-H reset level may be 2.7 V, and the difference between the LPD-H reset level and the SPD-H reset level may be 0.5 V.

Therefore, due to structural characteristics of a split PD including a plurality of transistors and the feed-through phenomenon, a reset level when reading out a first photocharge packet may be different from a reset level when reading out a second photocharge packet level. Based on such a reset level difference, at least one reset level and/or at least one pixel level may be outside the operating range of the first driving transistor DX1. This will be described later with reference to FIG. 4.

Figure 4:
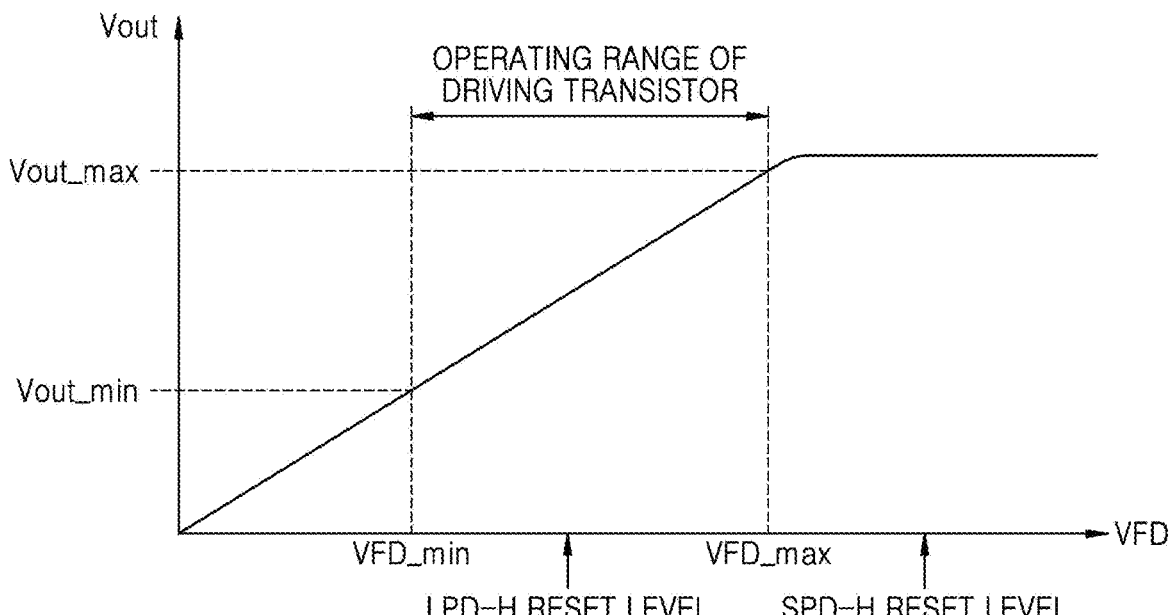
FIG. 4 is a diagram illustrating an operating range of a first driving transistor according to some example embodiments.

FIG. 4 is a graph illustrating the operating range of the first driving transistor DX1 according to some example embodiments and some comparative example embodiments.

FIG. 4 may be described with reference to FIG. 3. The horizontal axis of the graph of FIG. 4 may refer to the voltage VFD1 of the first floating diffusion node FD1 shown in FIG. 3, and the vertical axis of the graph of FIG. 4 may refer the output voltage Vout of the first driving transistor DX1 with reference to the voltage VFD of the first floating diffusion node FD1 included in each of the pixels 20a, 20b, and 30.

Referring to FIG. 4, some example embodiments of the operating range of the first driving transistor DX1 may be defined by a maximum operating voltage VFD_max and a minimum operating voltage VFD_min. The maximum operating voltage VFD_max may refer to the voltage VFD of the first floating diffusion node FD1 at a time point when the output voltage Vout of the first driving transistor DX1 increasing linearly in proportion to the voltage VFD of the first floating diffusion node FD1 stops increasing. The minimum operating voltage VFD_min may be determined by considering the headroom of the first driving transistor DX1. Therefore, the operating range of the first driving transistor DX1 may be set from the minimum operating voltage VFD_min to the maximum operating voltage VFD_max. Here, a region in which the voltage VFD of the first floating diffusion node FD1 is greater than the maximum operating voltage VFD_max may be referred to as a saturation region, and a region in which the voltage VFD of the first floating diffusion node FD1 is less than the minimum operating voltage VFD_min may be referred to as a headroom region.

When the voltage VFD of the first floating diffusion node FD1 is outside the operating range of the first driving transistor DX1, the output voltage Vout of the first driving transistor DX1 corresponding to the voltage VFD of the first floating diffusion node FD1 may not be output. For example, when the voltage VFD of the first floating diffusion node FD1 is greater than the maximum operating voltage VFD_max, that is, in the saturation region, the output voltage Vout of the first driving transistor DX1 corresponding to the voltage VFD of the first floating diffusion node FD1 may not be output, and thus image quality may deteriorate.

The output voltage Vout of the first driving transistor DX1 corresponding to the minimum operating voltage VFD_min may be referred to as a minimum output voltage Vout_min, the output voltage Vout of the first driving transistor DX1 corresponding to the maximum operating voltage VFD_max may be referred to as a maximum output voltage Vout_max, and a range between the minimum output voltage Vout_min and the maximum output voltage Vout_max may be referred to as a normal output voltage range.

Referring to the description of FIG. 3, when the first photocharge packet and the second photocharge packet of the pixel 30 are read out, there may be a difference between the LPD-H reset level and the SPD-H reset level, and due to the difference, at least one of the LPD-H reset level, the LPD-H pixel level, the LPD-L reset level, the SPD-H reset level, the SPD-H pixel level, the SPD-L reset level, and the SPD-L pixel level may be outside the outside the operating range of the first driving transistor DX1. For example, when the difference between the LPD-H reset level and the SPD-H reset level is 0.5 V, and the difference between the maximum operating voltage VFD_max and the minimum operating voltage VFD_min of the first driving transistor DX1 is less than 0.5 V, at least one of the LPD-H reset level and the SPD-H reset level may be outside the operating range of the first driving transistor DX1. Therefore, the voltage VFD of the first floating diffusion node FD1 may be in the saturation region or the headroom region, and thus the output voltage Vout of the first driving transistor DX1 corresponding to the voltage VFD of the first floating diffusion node FD1 may not be output, deteriorating image quality.

Figure 5:
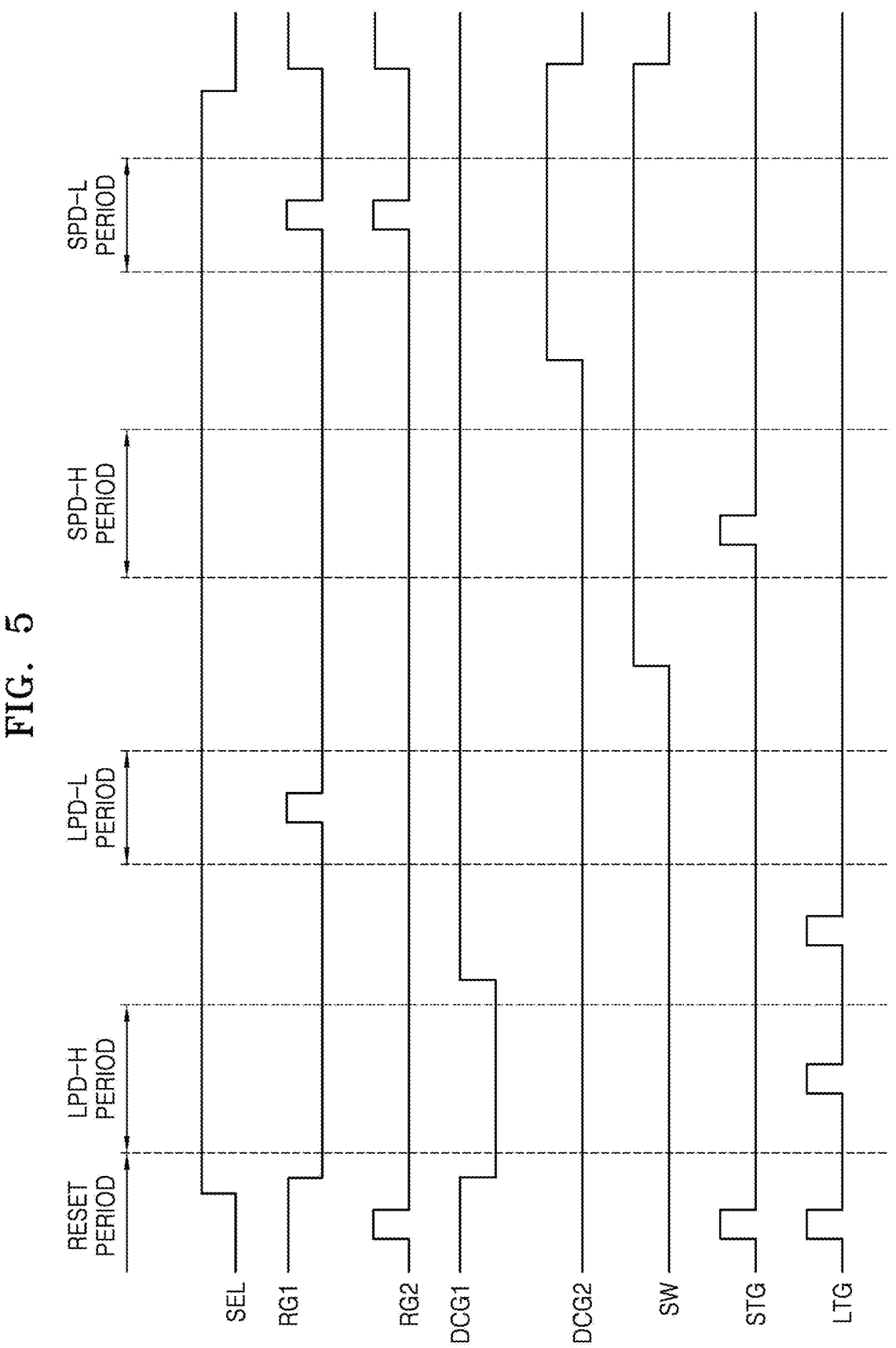
FIG. 5 is a timing diagram illustrating an operation of the image sensor when the image sensor includes the pixel shown in FIG. 2A according to some example embodiments.

FIG. 5 is a timing diagram illustrating an operation of the image sensor 100 when the image sensor 100 includes the pixel 20a shown in FIG. 2A according to some example embodiments.

Referring to FIG. 5, an operation of reading out a first photocharge packet and a second photocharge packet of the pixel 20a shown in FIG. 2A may be performed in the order of a reset period, an LPD-H period, an LPD-L period, an SPD-H period, and an SPD-L period.

The reset period may refer to a period before an LPD-H reset signal is read out during a readout period of the pixel 20a. The LPD-H period may refer to a period defined from the time of reading out the LPD-H reset signal to the time of reading out an LPD-H pixel signal, and the LPD-L period may refer to a period defined from the time of reading out an LPD-L pixel signal to the time of reading out an LPD-L reset signal. The SPD-H period may refer to a period defined from the time of reading out an SPD-H reset signal to the time of reading out an SPD-H pixel signal, and the SPD-L period may refer to a period defined from the time of reading out an SPD-L pixel signal to the time of reading out an SPD-L reset signal.

In the reset period, the row driver 120 may generate a first transfer control signal LTG, a second transfer control signal STG, a first reset control signal RG1, a second reset control signal RG2, and a first gain control signal DCG1 having active levels to reset the first photodiode LPD and the second photodiode SPD, reset the first floating diffusion node FD1 and the third floating diffusion node FD3 with the first reset power supply voltage Vrst1, and reset the second floating diffusion node FD2 with the second reset power supply voltage Vrst2. At this time, the row driver 120 may turn off the switch transistor SW by providing a switch control signal SWS having an inactive level, and thus the voltage of the second floating diffusion node FD2 may be different from the voltage of the first floating diffusion node FD1 and the voltage of the third floating diffusion node FD3. For example, when the first reset power supply voltage Vrst1 is 2.8 V, the voltage of the first floating diffusion node FD1 and the voltage of the third floating diffusion node FD3 may be 2.8 V. When the second reset power supply voltage Vrst2 is 2.3 V, the voltage of the second floating diffusion node FD2 may be 2.3 V.

In the reset period, the row driver 120 may provide the first gain control signal DCG1 and the first reset control signal RG1 having inactive levels to turn off the first conversion gain transistor CGX1 and the first reset transistor RX1. In this case, when the first reset transistor RX1 and the first conversion gain transistor CGX1 are turned off, the voltage of the first floating diffusion node FD1 and the voltage of the third floating diffusion node FD3 may decrease by the clock feedthrough phenomenon. For example, after the first reset transistor RX1 and the first conversion gain transistor CGX1 are turned off, the voltage of the first floating diffusion node FD1 may be 2.2 V that is less than 2.8 V. Thus, an LPD-H reset voltage may be 2.2 V.

In the reset period, when the second reset transistor RX2 is turned off by the low driver 120 inactivating the second reset control signal RG2, the voltage of the second floating diffusion node FD2 may decrease by the clock feedthrough phenomenon. For example, after the second reset transistor RX2 is turned off, the second floating diffusion node FD2 may be 2.0 V that is less than 2.3 V.

In the LPD-H period, the row driver 120 may provide the first gain control signal DCG1 having an inactive level to turn off the first conversion gain transistor CGX1.

In the LPD-L period, the row driver 120 may provide the first gain control signal DCG1 and the first reset control signal RG1 having active levels to turn on the first conversion gain transistor CGX1 and the first reset transistor RX1. When the first conversion gain transistor CGX1 and the first reset transistor RX1 are turned on, the first floating diffusion node FD1 and the third floating diffusion node FD3 may be reset with the first reset power supply voltage Vrst1. After resetting the first floating diffusion node FD1 and the third floating diffusion node FD3, the row driver 120 may provide the first reset control signal RG1 having an inactive level to turn off the first reset transistor RX1.

Between the LPD-L period and the SPD-H period, the row driver 120 may turn on the switch transistor SW by providing the switch control signal SWS having an active level. When the switch transistor SW is turned on in response to the switch control signal SWS, the voltage of the second floating diffusion node FD2 may increase by the clock feedthrough phenomenon. For example, as the switch transistor SW is turned on between the LPD-L period and the SPD-H period, the voltage of the second floating diffusion node FD2 may increase from 2.0 V to a range of about 2.2 V to about 2.3 V, and thus the difference between an LPD-H reset level (2.2 V) and an SPD-H reset level may be from 0 V to 0.1 V.

That is, the difference between the LPD-H reset level and the SPD-H reset level may be reduced by resetting the second floating diffusion node FD2 by using the second reset power supply voltage Vrst2 less than the first reset power supply voltage Vrst1, the second reset transistor RX2 positioned between the second floating diffusion node FD2, and the second reset power supply voltage Vrst2. Therefore, it may be possible to prevent or reduce image quality deterioration caused by an SPD-H reset level being outside the operating range of a driving transistor DX as in the example embodiments described above (refer to FIGS. 3 and 4).

In the SPD-H period, the row driver 120 may provide the first gain control signal DCG1 and the second transfer control signal STG having active levels to turn on the first conversion gain transistor CGX1 and the second transfer transistor STX, and may provide the second gain control signal DCG2 having an inactive level to turn off the second conversion gain transistor CGX2.

In the SPD-L period, the row driver 120 may provide the first gain control signal DCG1, the second gain control signal DCG2, and the second reset control signal RG2 having active gains to turn on the first conversion gain transistor CGX1, the second conversion gain transistor CGX2, and the second reset transistor RX2. At this time, because the switch transistor SW is in a turned-on state, the first floating diffusion node FD1, the second floating diffusion node FD2, and the third floating diffusion node FD3 may be reset with the second reset power supply voltage Vrst2. In addition, the row driver 120 may provide the first reset control signal RG1 having an active level to turn on the first reset transistor RX1, and thus the first floating diffusion node FD1, the second floating diffusion node FD2, and the third floating diffusion node FD3 may be reset by the first reset power supply voltage Vrst1 and the second reset power supply voltage Vrst2.

Compared with the pixel 20a shown in FIG. 2A, in the pixel 20b shown in FIG. 2B, the first conversion gain transistor CGX1 may be turned off by the row driver 120 providing a first gain control signal DCG1 having an inactive layer from the time of reading out an SPD-H reset signal to the time of reading out an SPD-L reset signal.

In the pixel 20b shown in FIG. 2B, the voltage VFD of the first floating diffusion node FD1 may also be maintained within the operating range of the first driving transistor DX1 based on the second reset transistor RX2 and the difference between the first reset power supply voltage Vrst1 and the second reset power supply voltage Vrst2 that is less than the first reset power supply voltage Vrst1, thereby preventing or reducing image quality deterioration in spite of the clock feedthrough phenomenon described with reference to FIGS. 3 and 4.

Figure 6A:
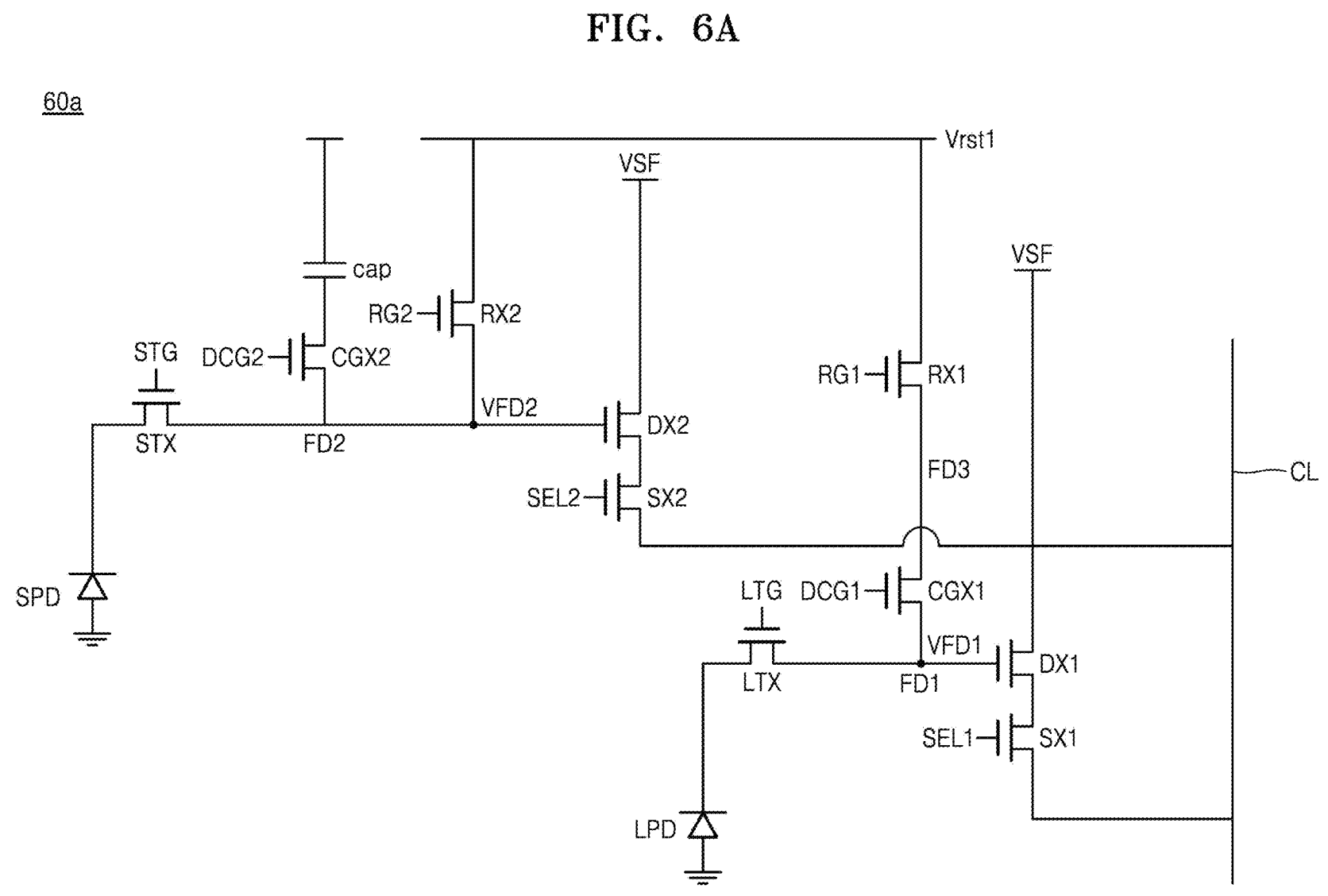
Figure 6B:
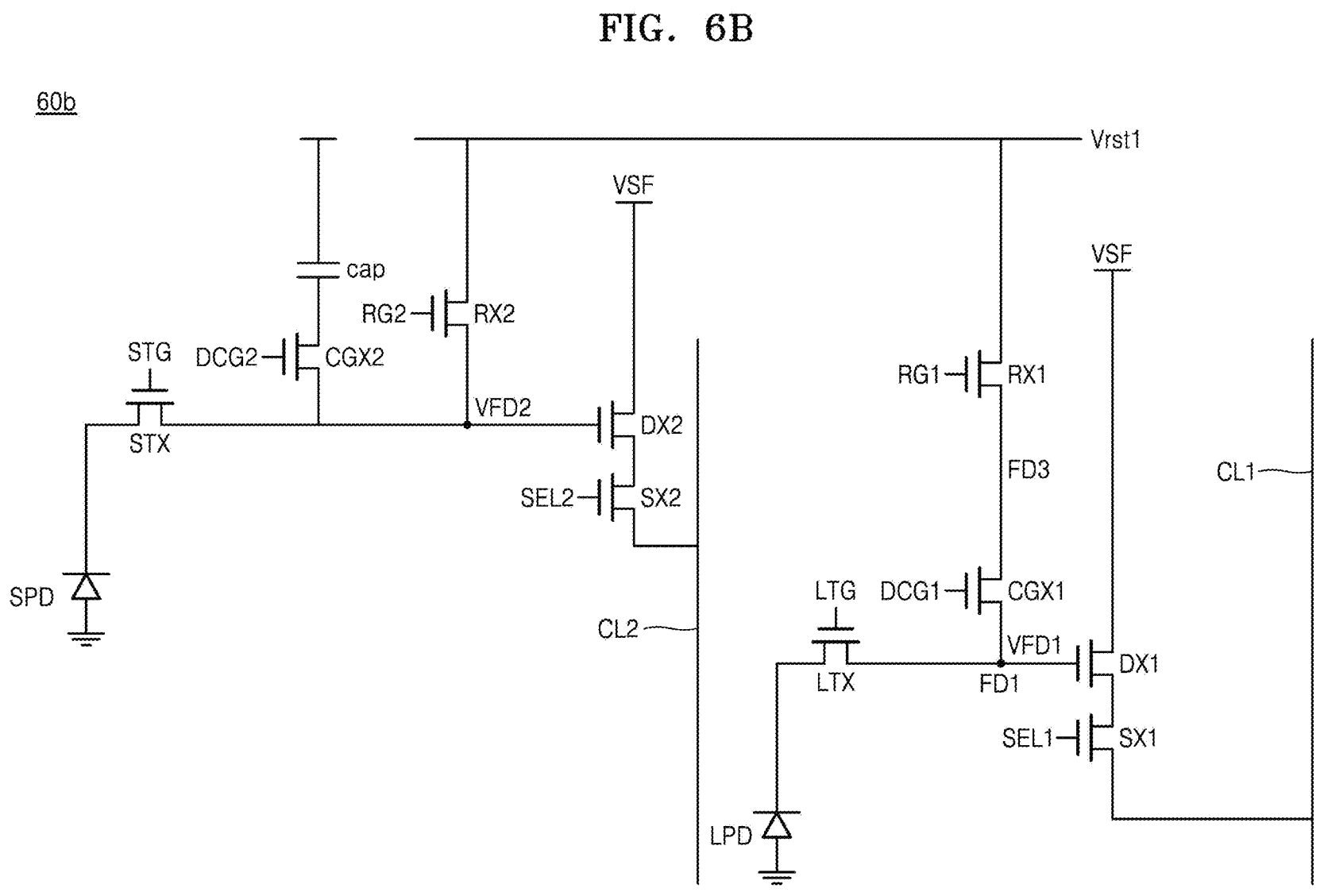
Figure 7:
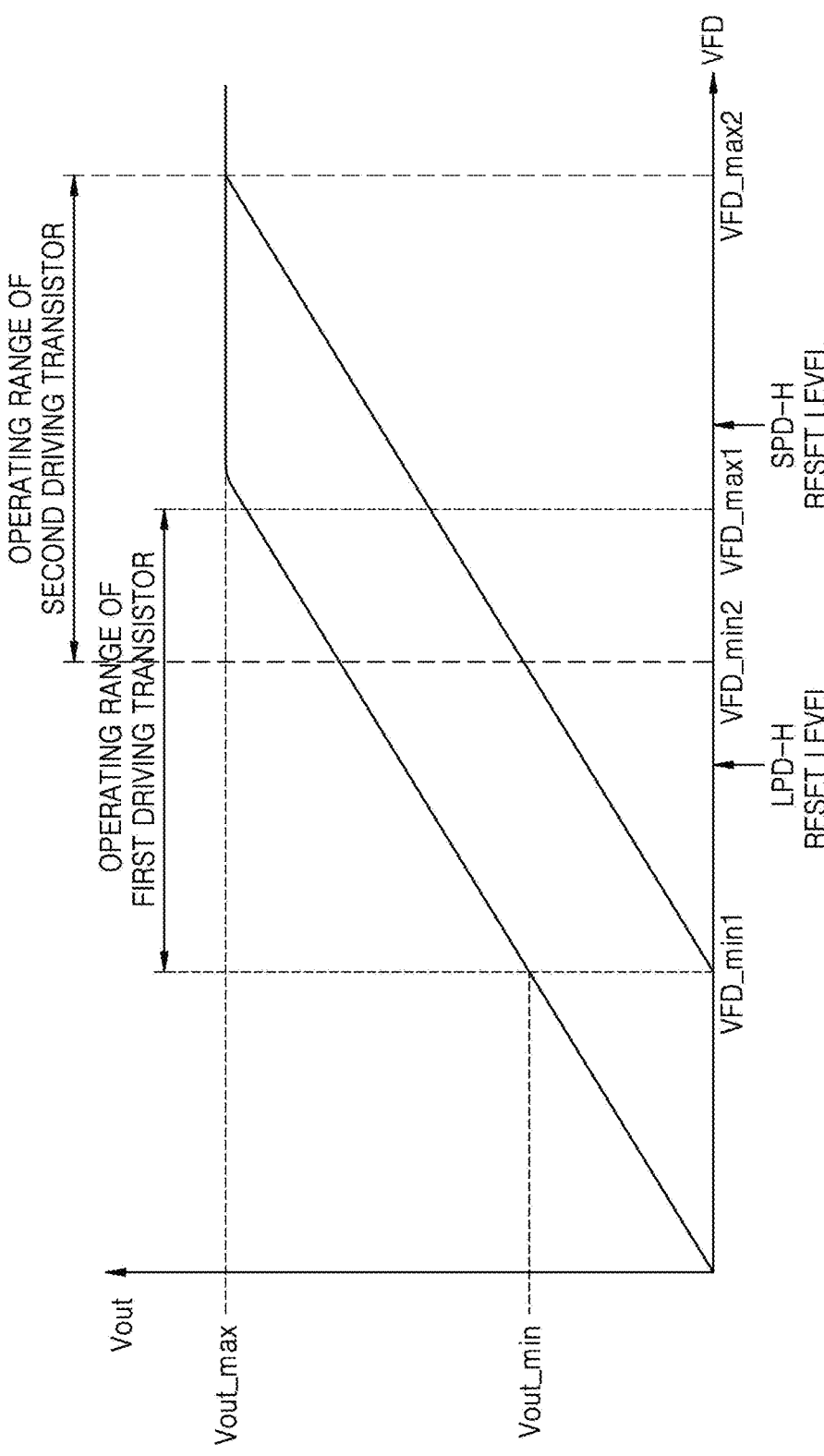
FIG. 7 is a diagram illustrating operating ranges of first and second driving transistors included in each of the pixels shown in FIGS. 6A and 6B, according to some example embodiments.

FIGS. 6A and 6B are circuit diagrams illustrating pixels PX 60a and 60b according to some example embodiments. FIG. 7 is a diagram illustrating operating ranges of a first driving transistor DX1 and a second driving transistor DX2 included in each of the pixels 60a and 60b of FIGS. 6A and 6B, according to some example embodiments.

Referring to FIGS. 6A and 6B, compared with the pixels 20a and 20b shown in FIGS. 2A and 2B, each of the pixels 60a and 60b may further include a second driving transistor DX2 and a second selection transistor SX2 and may not include a switch transistor SW. In addition, a first reset transistor RX1 and a second reset transistor RX2 may be connected to the same voltage. For example, the first reset transistor RX1 and the second reset transistor RX2 may be connected to a first reset power supply voltage Vrst1.

Even when the pixels 60a and 60b shown in FIGS. 6A and 6B are read out, the clock feedthrough phenomenon described with reference to FIG. 3 may occur.

Unlike the pixel 20a shown in FIG. 2A, the first reset transistor RX1 and the second reset transistor RX2 of each of the pixels 60a and 60b shown in FIGS. 6A and 6B are both connected to the first reset power supply voltage Vrst1, but each of the pixels 60a and 60b includes the first driving transistor DX1 and the second driving transistor DX2 having different operating ranges. Thus, despite the clock feedthrough phenomenon, a reset level and a pixel level that are based on a first photocharge packet may be within the operating range of the first driving transistor DX1, and a reset level and a pixel level that are based on a second photocharge packet may be within the operating range of the second driving transistor DX2.

Referring to FIG. 6A, an end of each of first and second selection transistors SX1 and SX2 may be connected to the same column line CL. Therefore, pixel signals and reset signals that are based on the first photocharge packet and the second photocharge packet may all be read out through one column line CL.

Referring to FIG. 6B, an end of the first selection transistor SX1 may be connected to a first column line CL1, and an end of the second selection transistor SX2 may be connected to a second column line CL2. That is, unlike in FIG. 6A, a reset signal and a pixel signal that are based on the first photocharge packet may be read out through the first column line CL1, and a reset signal and a pixel signal that are based on the second photocharge packet may be read out through the second column line CL2.

Because the pixel 60b shown in FIG. 6B is read out through two column lines, that is, the first and second column lines CL1 and CL2, the pixel 60b shown in FIG. 6B may be read out at a higher speed than the pixel 60a shown in FIG. 6A. For example, because the first photocharge packet and the second photocharge packet of the pixel 60b shown in FIG. 6B are read out through the first and second column lines CL1 and CL2, the readout speed thereof may be twice the readout speed of the first photocharge packet and the second photocharge packet of the pixel 60a shown in FIG. 6A that uses one column line CL.

Referring to FIG. 7, the operating range of the second driving transistor DX2 may be different from the operating range of the first driving transistor DX1. A minimum operating voltage VFD_min1 of the first driving transistor DX1 may be less than a minimum operating voltage VFD_min2 of the second driving transistor DX2, and a maximum operating voltage VFD_max1 of the first driving transistor DX1 may be less than a maximum operating voltage VFD_max2 of the second driving transistor DX2. Therefore, despite the difference between an LPD-H reset level and an SPD-H reset level that is caused by the clock feedthrough phenomenon, the LPD-H reset level may be within the operating range of the first driving transistor DX1, and the SPD-H reset level may be within the operating range of the second driving transistor DX2, thereby preventing or reducing image quality deterioration.

Therefore, a reset level and a pixel level that are based on a first photodiode LPD may be within the operating range of the first driving transistor DX1, and a reset level and a pixel level that are based on a second photodiode SPD may be within the operating range of the second driving transistor DX2. For example, referring to FIG. 7, despite the difference between the LPD-H reset level and the SPD-H reset level that are caused by the clock feedthrough phenomenon, the LPD-H reset level is within the operating range of the first driving transistor DX1 such that an LPD-H reset signal may be read out through the first driving transistor DX1, and the SPD-H reset level is within the operating range of the second driving transistor DX2 such that an SPD-H reset signal may be read out through the second driving transistor DX2, thereby preventing or reducing image quality deterioration caused by the clock feedthrough phenomenon.

Figure 8:
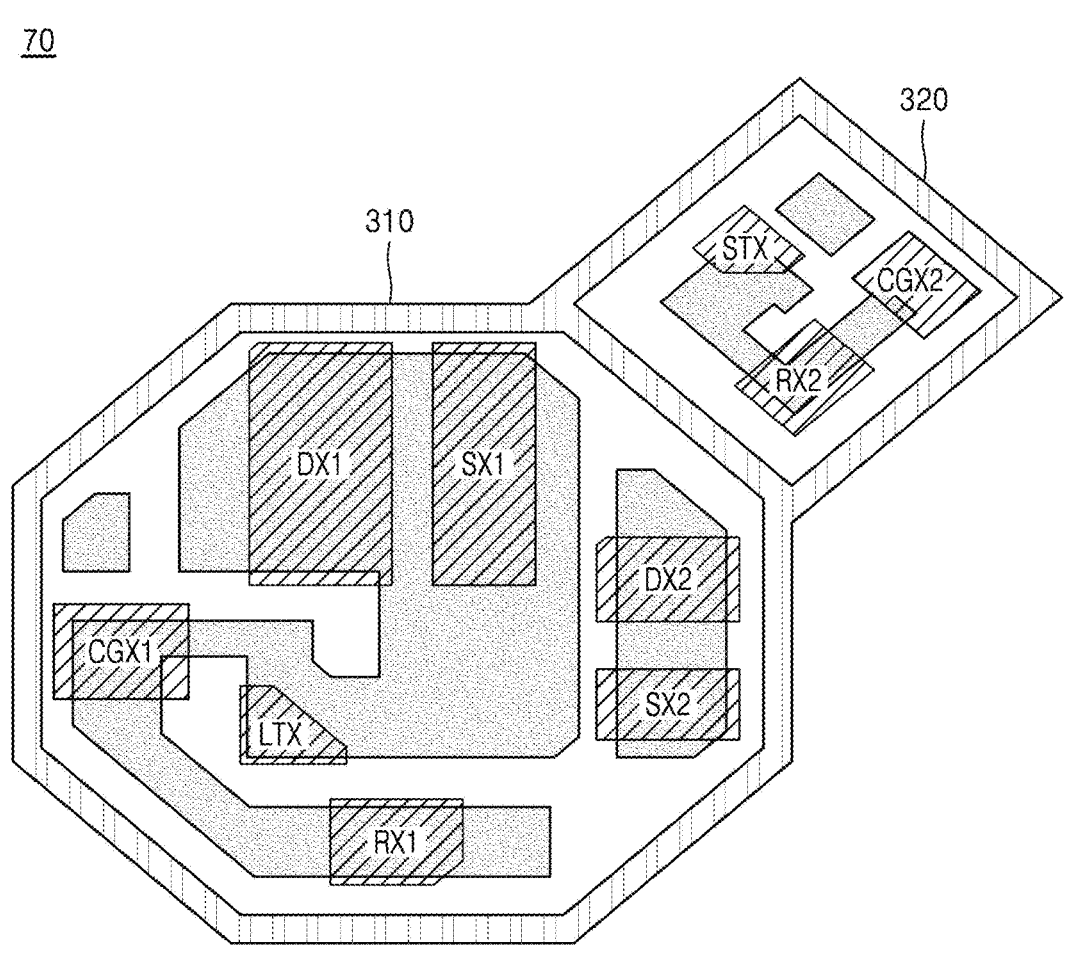
FIG. 8 illustrates a layout design for the pixels shown in FIGS. 6A and 6B according to some example embodiments.

FIG. 8 may be a layout designed for the pixels 60a and 60b shown in FIGS. 6A and 6B according to some example embodiments.

Referring to FIG. 8, a pixel 70 may be any one of the pixels 60a and 60b shown in FIGS. 6A and 6B, and each of the pixels 60a and 60b shown in FIGS. 6A and 6B may be formed in a first pixel region 310 and a second pixel region 320. A first photodiode LPD may be formed in the first pixel region 310, and a second photodiode SPD may be formed in the second pixel region 320. The first pixel region 310 may have a larger area than the second pixel region 320, and thus, the first photodiode LPD may have a larger light-receiving area than the second photodiode SPD.

The first photodiode LPD and the second photodiode SPD may be disposed adjacent to each other. In this case, the first photodiode LPD and the second photodiode SPD may be separate from each other by a device isolation layer to separate a first photocharge packet generated by the first photodiode LPD and a second photocharge packet generated by the second photodiode SPD. Therefore, the boundary of the area of the first photodiode LPD and the boundary of the area of the second photodiode SPD may be defined by the device isolation layer.

A first transfer transistor LTX, a first reset transistor RX1, a first driving transistor DX1, a first selection transistor SX1, and a first conversion gain transistor CGX1 may be arranged in the first pixel region 310, and a second driving transistor DX2 and a second selection transistor SX2 may be further arranged in the first pixel region 310.

A second transfer transistor STX, a second reset transistor RX2, a second conversion gain transistor CGX2 may be arranged in the second pixel region 320. A capacitor cap having a larger capacitance than the capacitance of parasitic capacitors of first to third floating diffusion nodes FD1, FD2, and FD3 may be further arranged in the second pixel region 320. Although FIG. 8 illustrates that the second pixel region 320 includes the second reset transistor RX2, the second reset transistor RX2 may be disposed in the first pixel region 310 in other embodiments. That is, transistors (for example, the second driving transistor DX2 and the second selection transistor SX2) for generating a pixel signal according to a photocharge formed in the second photodiode SPD may be arranged in the first pixel region 310 having a relatively large area instead of being arranged in the second pixel region 320 in which the second photodiode SPD is formed, thereby securing a space for arrange transistors.

Figure 9A:
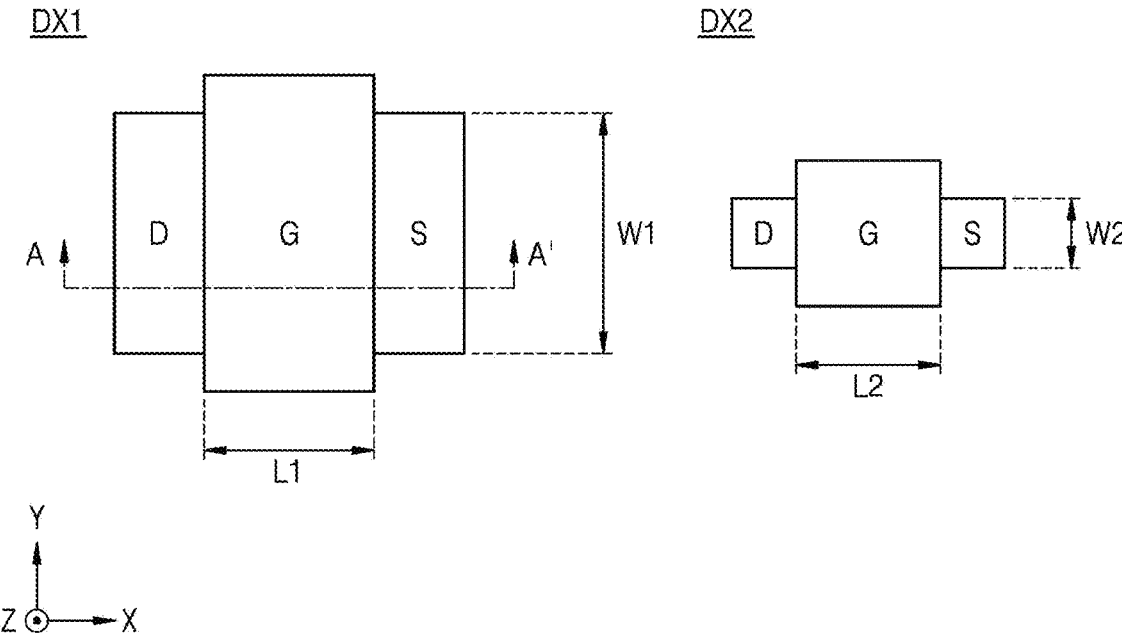
FIG. 9A illustrates a layout of a first driving transistor and a layout of a second driving transistor according to some example embodiments.
Figure 9B:
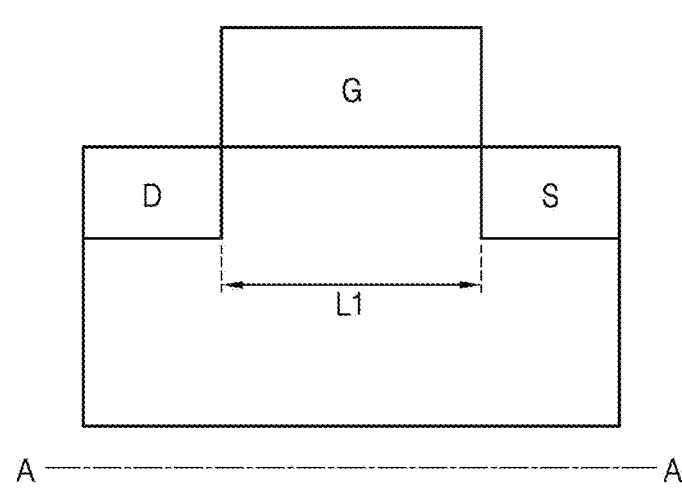
FIG. 9B is a cross-sectional view of the first driving transistor according to some example embodiments.
Figure 9B:
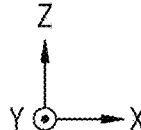

FIG. 9A is a view illustrating a layout of a first driving transistor DX1 and a layout of a second driving transistor DX2 according to embodiments, and FIG. 9B is a cross-sectional view including the first driving transistor DX1.

In FIGS. 9A and 9B, X, Y, and Z directions are perpendicular to each other.

FIGS. 9A and 9B may be described with reference to FIG. 7, and repeating descriptions may be omitted. The difference between the operating ranges of the first driving transistor DX1 and the second driving transistor DX2 has been described with reference to FIG. 7. A relationship between the structures and the operating ranges of the first driving transistor DX1 and the second driving transistor DX2 will now be described with reference to FIGS. 9A and 9B.

Referring to FIG. 9A, some example embodiments of the first driving transistor DX1 and the second driving transistor DX2 are viewed in the Z direction perpendicular to the X direction and the Y direction. FIG. 9B is a cross-sectional view taken along line A-A' of FIG. 9A to illustrates the first driving transistor DX1. Referring to FIGS. 9A and 9B, each of the first driving transistor DX1 and the second driving transistor DX2 may include a gate G, a source S, and a drain D. A channel width W1 of the first driving transistor DX1 may refer to the length of the drain D and/or the length of the source S in the Y direction, and a channel length L1 of the first driving transistor DX1 may refer to a length from the drain D to the source S in the X direction. A channel width W2 and a channel length L2 of the second driving transistor DX2 may be similarly defined.

A channel area of each of the first driving transistor DX1 and the second driving transistor DX2 may be equal to the product of the channel width and the channel length of each of the first driving transistor DX1 and the second driving transistor DX2. In addition, the ratio of channel width to channel length may be indicated with W/L. For example, the channel area of the first driving transistor DX1 may be $W1 \times L1$, and the channel width/channel length ratio of the first driving transistor DX1 may be $W1/L1$.

A threshold voltage of the first driving transistor DX1 may decrease as the channel width W1 increases and the channel length L1 decreases. Similarly, a threshold voltage of the second driving transistor DX2 may decrease as the channel width W2 increases and the channel length L2 decreases. Referring to FIG. 9A, $W1/L1$ of the first driving transistor DX1 may be greater than $W2/L2$ of the second driving transistor DX2, and thus, the threshold voltage of the first driving transistor DX1 may be less than the threshold voltage of the second driving transistor DX2.

The operating ranges of the first driving transistor DX1 and the second driving transistor DX2 may be determined by the threshold voltage of the first driving transistor DX1 and the threshold voltage of the second driving transistor DX2. The threshold voltage of a transistor refers to a minimum gate voltage for allowing current to flow through the transistor. Therefore, the greater the threshold voltage, the greater the minimum operating voltage VFD_min and the maximum operating voltage VFD_max. For example, referring to FIG. 7, the threshold voltage of the second driving transistor DX2 may be the minimum operating voltage VFD_min1 of the first driving transistor DX1 that is greater than the threshold voltage of the first driving transistor DX1. Therefore, the minimum operating voltage VFD_min2 and the maximum operating voltage VFD_max2 of the second driving transistor DX2 having a relatively great threshold voltage may be respectively greater than the minimum operating voltage VFD_min1 and the maximum operating voltage VFD_max1 of the first driving transistor DX1.

Therefore, when $W1/L1$ of the first driving transistor DX1 is set to be greater than $W2/L2$ of the second driving transistor DX2, the operating range of the first driving transistor DX1 and the operating range of the second driving transistor DX2 may be set to be different from each other as described with reference to FIG. 7, and thus an LPD-H reset level and an SPD-H reset level may be respectively within the operating range of the first driving transistor DX1 and the operating range of the second driving transistor DX2 in spite of the clock feed-through phenomenon.

Figure 10:
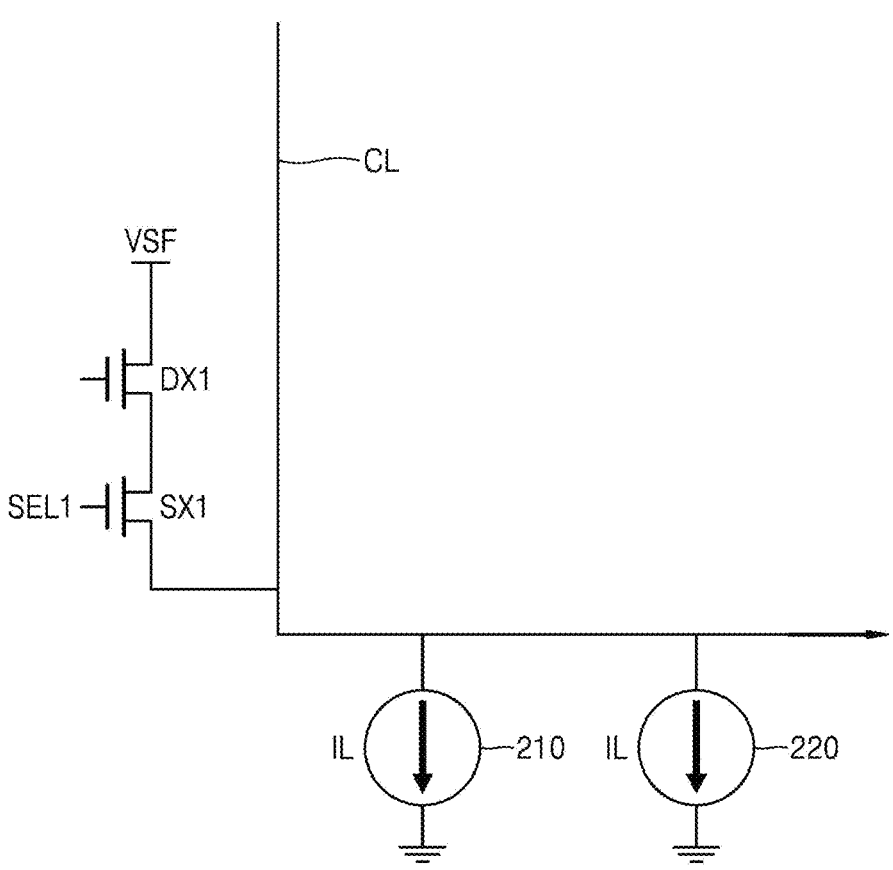
FIG. 10 is a circuit diagram illustrating a first current source and a second current source connected to a column line according to some example embodiments.

FIG. 10 is a circuit diagram illustrating a first current source 210 and a second current source 220 connected to a column line CL according to some example embodiments.

Referring to FIG. 10, the image sensor 100 may include the first current source 210 and the second current source 220 connected to the column line CL. The first current source 210 and the second current source 220 may be connected in parallel to each other, and the first current source 210 and the second current source 220 may provide bias current IL to the column line CL.

The second current source 220 may be turned off when the voltage of the first floating diffusion node FD1 is read out based on a first photocharge packet, and may be turned on when the voltage of the first floating diffusion node FD1 is read out based on a second photocharge packet. In addition, the first current source 210 may be turned on when the voltage of the first floating diffusion node FD1 is read out based on the first photocharge packet and when the voltage of the first floating diffusion node FD1 is read out based on the second photocharge packet. Therefore, the amount of bias current IL flowing through the column line CL may be larger when the voltage of the first floating diffusion node FD1 is read out based on the second photocharge packet than when the voltage of the first floating diffusion node FD1 is read out based on the first photocharge packet.

As described above with reference to FIG. 3, the first driving transistor DX1 may operate as a source follower based on bias current IL generated by the current source CS connected to the column line CL.

$$t_D = \frac{1}{2}(\mu_n C_{ox})\left(\frac{W}{L}\right)(v_{GS} - V_{th})^2(1 + \lambda v_{DS}) \qquad \text{[Equation 1]}$$

Current flowing through the first driving transistor DX1 may be calculated using Equation 1 above. In Equation 1, $i_D$ refers to current (bias current IL) flowing through the first driving transistor DX1, and $v_{GS}$ refers to a voltage difference between the voltage of a source terminal and the voltage of a gate terminal of the first driving transistor DX1. Other parts of Equation 1 may represent characteristics of the first driving transistor DX1 that are determined by process conditions. For example, $V_{th}$ may refer to the threshold voltage of the first driving transistor DX1, Cox may refer to capacitance, $v_{DS}$ may refer to the voltage difference between the voltage of a drain terminal and a voltage of a source terminal, W may refer to the channel width of the first driving transistor DX1, and L may refer to the channel length of the first driving transistor DX1.

In Equation 1, parts other than the current $i_D$ and the voltage difference $v_{GS}$ are determined by process conditions and may thus be treated as constants. Thus, according to Equation 1, when the current $i_D$ increases, the voltage difference $v_{GS}$ may also increase. The voltage difference $v_{GS}$ is obtained by subtracting the voltage of the source terminal of the first driving transistor DX1 from the voltage of the gate terminal of the first driving transistor DX1, and thus, when the current $i_D$ is increased while the voltage of the gate terminal is maintained, output voltage Vout (refer to FIG. 3), which is the voltage of the source terminal voltage of the first driving transistor DX1, may be reduced. Because the voltage of the gate terminal of the first driving transistor DX1 is equal to the voltage of the first floating diffusion node FD1, the gate terminal voltage of the first driving transistor DX1 does not vary. Therefore, the output voltage Vout may be reduced by increasing the bias current IL.

As described above with reference to FIG. 3, an SPD-H reset level may be greater than an LPD-H reset level due to the clock feed-through phenomenon and may thus be outside the operating range of the first driving transistor DX1, and in some example embodiments, the output voltage Vout of the first driving transistor DX1 corresponding to the SPD-H reset level may be in the saturation region. Therefore, when the SPD-H reset level is read out, the output voltage Vout of the first driving transistor DX1 may be lowered by increasing the bias current IL ($i_D$ in Equation 1) to locate the SPD-H reset level within a normal range of the output voltage Vout of the first driving transistor DX1.

Therefore, when LPD reset signals and LPD pixel signals are generated, the first current source 210 may be turned on but the second current source 220 may be turned off, and when SPD reset signals and SPD pixel signals are generated, the first current source 210 and the second current source 220 may all be turned on to increase the bias current IL. As a result, the output voltage Vout may be within a normal output range for each of an LPD-H reset level, an LPD-H pixel level, an LPD-L reset level, an SPD-H reset level, an SPD-H pixel level, an SPD-L reset level, and an SPD-L pixel level.

According to some example embodiments, bias current provided by the second current source 220 may be proportional to the difference between the LPD-H reset level and the SPD-H reset level.

Figure 11:
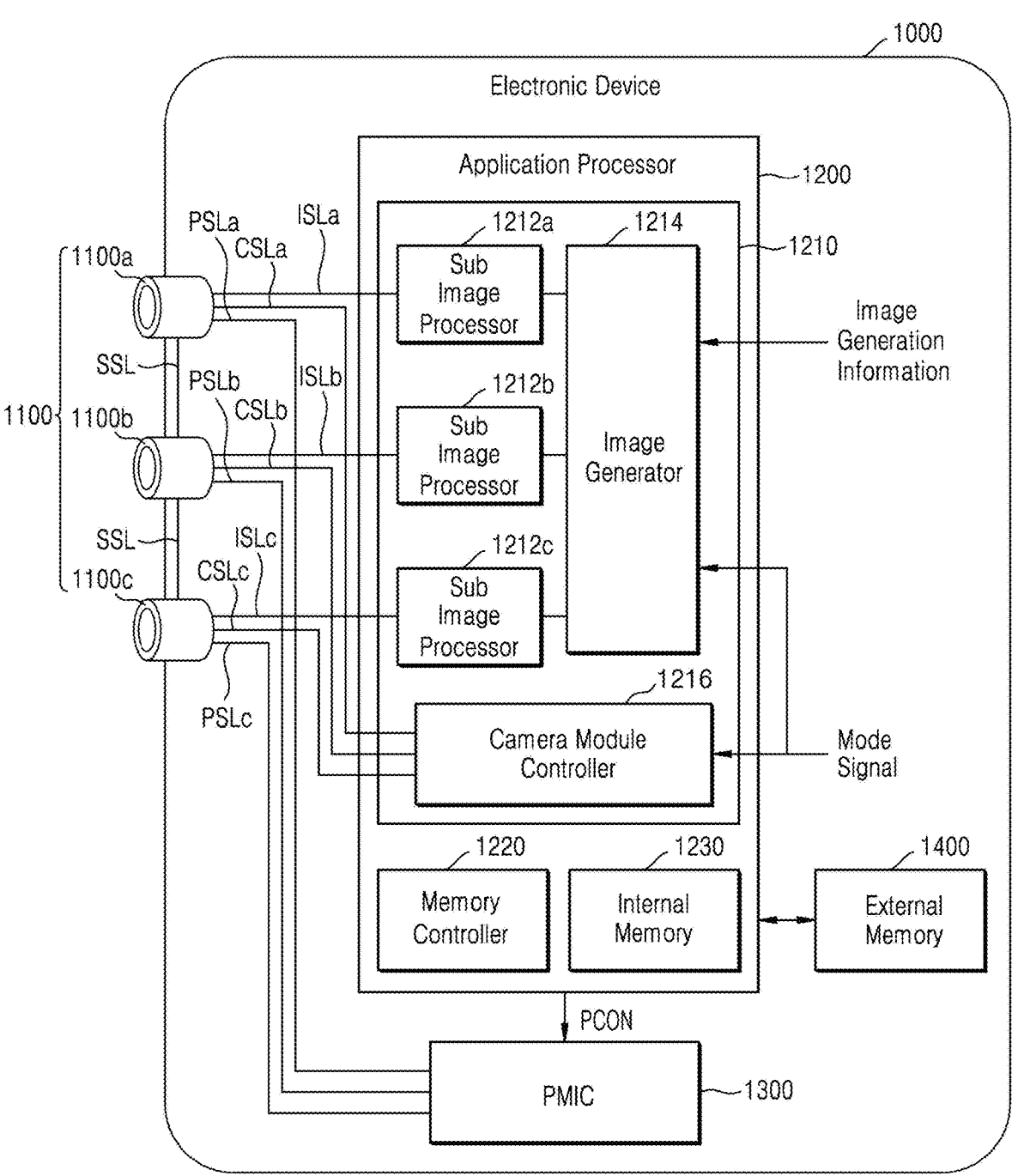
FIG. 11 is a block diagram illustrating an electronic device including multiple camera modules according to some example embodiments.
Figure 12:
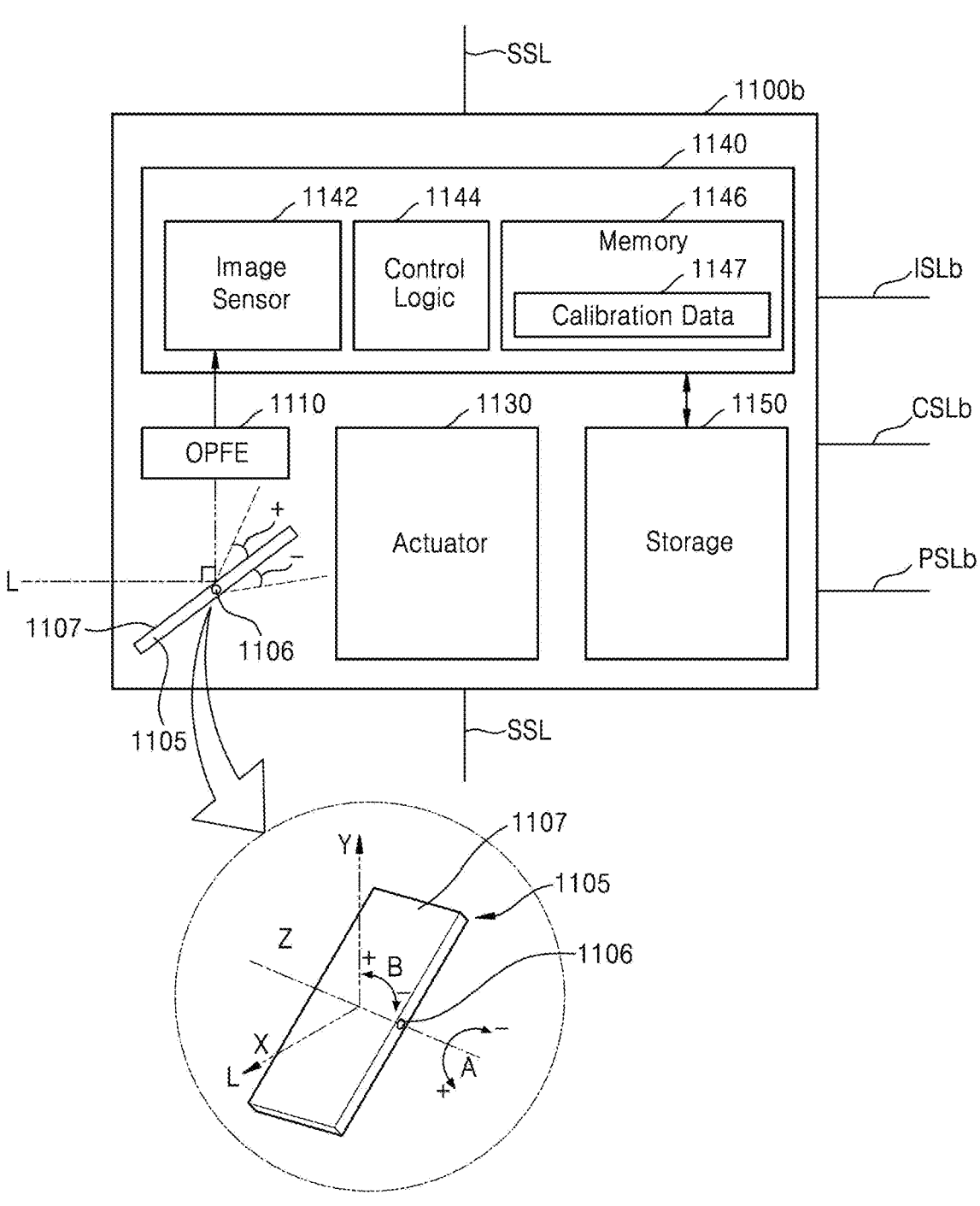
FIG. 12 is a block diagram illustrating a camera module shown in FIG. 11 according to some example embodiments.

FIG. 11 is a block diagram illustrating an electronic device 1000 including multiple camera modules, according to some example embodiments. FIG. 12 is a block diagram illustrating a camera module 1100b of the electronic device 1000 shown in FIG. 11.

Referring to FIG. 11, the electronic device 1000 may include a camera module group 1100, an application processor 1200, a power management integrated circuit (PMIC) 1300, and an external memory 1400.

The camera module group 1100 may include a plurality of camera modules 1100a, 1100b, and 1100c. Although three camera modules 1100a, 1100b, and 1100c are illustrated in example embodiments depicted in FIG. 11. However, example embodiments are not limited thereto. In some example embodiments, the camera module group 1100 may be modified to include only two camera modules. In some example embodiments, the camera module group 1100 may be modified to include k camera modules, where k refers to any natural number greater than or equal to 4.

The configuration of the camera module 1100b will be described below with reference to FIG. 12. The following description of the camera module 1100b may also be applied to the other camera modules 1100a and 1100c.

Referring to FIG. 12, some example embodiments of the camera module 1100b may include a prism 1105, an optical path folding element (OPFE) 1110, an actuator 1130, an image sensing device 1140, and a storage 1150.

The prism 1105 may include a reflective surface 1107 of a light reflecting material and may change the path of light L incident from the outside.

In some embodiments, the prism 1105 may change the path of light L incident in a first direction (X direction) to a second direction (Y direction) perpendicular to the first direction (X direction). The prism 1105 may rotate the reflective surface 1107 of the light reflecting material in a direction A around a center shaft 1106 or rotate the center shaft 1106 in a direction B to change the path of light L incident in the first direction (X direction) to the second direction (Y direction) perpendicular to the first direction (X direction). In this case, the OPFE 1110 may move in a third direction (Z direction) that is perpendicular to both of the first direction (X direction) and the second direction (Y direction).

In some embodiments, as illustrated in FIG. 12, an A-direction maximum rotation angle of the prism 1105 may be less than or equal to 15 degrees in a positive (+) direction A and greater than 15 degrees in a negative (−) direction A. However, embodiments are not limited thereto.

In some embodiments, the prism 1105 may move by an angle of about 20 degrees or in a range from about 10 degrees to about 20 degrees or from about 15 degrees to about 20 degrees in a positive (+) or negative (−) direction B. In this case, an angle by which the prism 1105 moves in the positive (+) direction B may be the same as or similar, within a difference of about 1 degree, to an angle by which the prism 1105 moves in the negative (−) direction B.

In some embodiments, the prism 1105 may move the reflective surface 1107 of the light reflecting material in the third direction (Z direction) parallel with an extension direction of the center shaft 1106.

The OPFE 1110 may include, for example, m optical lenses where m refers to a natural number. The m optical lenses may move in the second direction (Y direction) and change an optical zoom ratio of the camera module 1100b. For example, when the default optical zoom ratio of the camera module 1100b is Z, the optical zoom ratio of the camera module 1100b may be changed to 3Z, 5Z, or greater by moving the m optical lenses included in the OPFE 1110.

The actuator 1130 may move the OPFE 1110 or an optical lens to a certain position. For example, the actuator 1130 may adjust the position of the optical lens such that an image sensor 1142 may be positioned at a focal length of the optical lens for accurate sensing.

The image sensing device 1140 may include the image sensor 1142, a control logic 1144, and a memory 1146. The image sensor 1142 may sense an image of an object using light L provided through the optical lens. The image sensor 1142 may generate image data having a high motion range by merging HCG image data with LCG image data. The image sensor 1142 may include a second reset transistor RX2 and a split photodiode (PD) including a plurality of photodiodes, and the split photodiode (split PD) may include an LPD having a relatively large light-receiving area and an SPD having a relatively small light-receiving area. Each of the LPD and the SPD may be read out in an HCG mode and an LCG mode.

The control logic 1144 may control operations of the camera module 1100b. For example, the control logic 1144 may control operations of the camera module 1100b according to control signals provided through a control signal line CSLb.

The memory 1146 may store information, such as calibration data 1147, necessary for operations of the camera module 1100b. The calibration data 1147 may include information that is necessary for the camera module 1100b to generate image data using light L incident from the outside. For example, the calibration data 1147 may include information about the degree of rotation, information about a focal length, information about an optical axis, or the like. When the camera module 1100b is implemented as a multi-state camera that has a focal length varying with the position of the optical lens, the calibration data 1147 may include a focal length value for each position (or state) of the optical lens and information about auto focusing.

The storage 1150 may store image data sensed by the image sensor 1142. The storage 1150 may be provided outside the image sensing device 1140 and may form a stack with a sensor chip of the image sensing device 1140. In some embodiments, the storage 1150 may include electrically erasable programmable read-only memory (EEPROM). However, embodiments are not limited thereto.

Referring to FIGS. 11 and 12, in some embodiments, the camera modules 1100a, 1100b, and 1100c may respectively include actuators 1130. In this case, the camera modules 1100a, 1100b, and 1100c may include the same or different pieces of calibration data 1147 according to operations of the actuators 1130 of the camera modules 1100a, 1100b, and 1100c.

In some embodiments, one (for example, the camera module 1100b) of the camera modules 1100a, 1100b, and 1100c may be of a folded-lens type including the prism 1105 and the OPFE 1110 while the other camera modules (for example, the camera modules 1100a and 1100c) may be of a vertical type that does not include the prism 1105 and the OPFE 1110. However, embodiments are not limited thereto.

In some example embodiments, one (for example, the camera module 1100c) of the camera modules 1100a, 1100b, and 1100c may include a depth camera of a vertical type that is capable of extracting depth information using infrared (IR) rays. In this case, the application processor 1200 may generate a 3D depth image by merging image data provided from the depth camera with image data provided from another camera module (for example, the camera module 1100a or 1100b).

In some example embodiments, at least two camera modules (for example, the camera modules 1100a and 1100b) among the camera modules 1100a, 1100b, and 1100c may have different fields of view. In this case, for example, the at least two camera modules (for example, the camera modules 1100a and 1100b) among the camera modules 1100a, 1100b, and 1100c may respectively have different optical lenses. However, example embodiments are not limited thereto.

In some example embodiments, the camera modules 1100a, 1100b, and 1100c may have fields of view that are different from each other. In this case, the camera modules 1100a, 1100b, and 1100c may have different optical lenses. However, example embodiments are not limited thereto.

In some example embodiments, the camera modules 1100a, 1100b, and 1100c may be physically separated from each other. That is, instead of dividing the sensing area of one image sensor 1142 for the camera modules 1100a, 1100b, and 1100c, the camera modules 1100a, 1100b, and 1100c may respectively include independent image sensors 1142.

Referring back to FIG. 11, the application processor 1200 may include an image processing unit 1210, a memory controller 1220, and an internal memory 1230. The application processor 1200 may be implemented separately from the camera modules 1100a, 1100b, and 1100c. For example, the application processor 1200 and the camera modules 1100a, 1100b, and 1100c may be implemented in different semiconductor chips separate from each other.

The image processing unit 1210 may include a plurality of sub-image processors 1212a, 1212b, and 1212c, an image generator 1214, and a camera module controller 1216.

The image processing unit 1210 may include as many sub-image processors 1212a, 1212b, and 1212c as the number of camera modules 1100a, 1100b, and 1100c.

Pieces of image data respectively generated by the camera modules 1100a, 1100b, and 1100c may be respectively provided to the sub-image processors 1212a, 1212b, and 1212c through image signal lines ISLa, ISLb, and ISLc separated from each other. For example, image data generated by the camera module 1100a may be provided to the sub-image processor 1212a through the image signal line ISLa, image data generated by the camera module 1100b may be provided to the sub-image processor 1212b through the image signal line ISLb, and image data generated by the camera module 1100c may be provided to the sub-image processor 1212c through the image signal line ISLc. Such image data transmission may be performed using, for example, camera serial interface (CSI) that is based on mobile industry processor interface (MIPI). However, embodiments are not limited thereto.

In some embodiments, a single sub-image processor may be provided for a plurality of camera modules. For example, the sub-image processors 1212a and 1212c may not be separated but may be integrated into a single sub-image processor, and the image data provided from the camera module 1100a or the camera module 1100c may be selected by a selection element (for example, a multiplexer) and then provided to the integrated sub-image processor.

The image data provided to each of the sub-image processors 1212a, 1212b, and 1212c may be provided to the image generator 1214. The image generator 1214 may generate an output image using the image data provided from each of the sub-image processors 1212a, 1212b, and 1212c according to image generation information or a mode signal.

For example, according to the image generation information or the mode signal, the image generator 1214 may generate the output image by merging at least portions of pieces of image data that are respectively generated by the camera modules 1100a, 1100b, and 1100c having different fields of view. In addition, according to the image generation information or the mode signal, the image generator 1214 may generate the output image by selecting one of pieces of image data that are respectively generated by the camera modules 1100a, 1100b, and 1100c having different fields of view.

In some embodiments, the image generation information may include a zoom signal or a zoom factor. In some embodiments, the mode signal may be based on a mode selected by a user.

When the image generation information includes a zoom signal (zoom factor) and the camera modules 1100a, 1100b, and 1100c have different fields of view, the image generator 1214 may perform different operations according to the type of the zoom signal. For example, when the zoom signal is a first signal, the image generator 1214 may merge image data output from the camera module 1100a with image data output from the camera module 1100c, and may then generate an output image by using an image signal obtained by the merging and image data output from the camera module 1100b and not merged with other image data. When the zoom signal is a second signal different from the first signal, the image generator 1214 may generate an output image by selecting one of the pieces of image data respectively output from the camera modules 1100a, 1100b, and 1100c, instead of merging the pieces of image data with each other. However, example embodiments are not limited thereto, and a method of processing image data may be changed whenever necessary.

In some example embodiments, the image generator 1214 may receive a plurality of pieces of image data, which have different exposure times, from at least one of the sub-image processors 1212a, 1212b, and 1212c and may perform high dynamic range (HDR) processing on the pieces of image data, thereby generating merged image data having an increased dynamic range.

The camera module controller 1216 may provide a control signal to each of the camera modules 1100a, 1100b, and 1100c. A control signal generated by the camera module controller 1216 may be provided to a corresponding one of the camera modules 1100a, 1100b, and 1100c through the control signal lines CSLa, CSLb, and CSLc that are separate from each other.

One (for example, the camera module 1100b) of the camera modules 1100a, 1100b, and 1100c may be designated as a master camera module according to the mode signal or the image generation signal including a zoom signal, and the other camera modules (for example, the camera modules 1100a and 1100c) may be designated as slave camera modules. Such designation information may be included in a control signal and provided to a corresponding one of the camera modules 1100a, 1100b, and 1100c through the control signal lines CSLa, CSLb, and CSLc that are separate from each other.

A camera module operating as a master or a slave may be determined according to a zoom factor or an operation mode signal. For example, when the field-of-view of the camera module 1100a is greater than that of the camera module 1100b and the zoom factor indicates a low zoom ratio, the camera module 1100a may operate as a master and the camera module 1100b may operate as a slave. Contrarily, when the zoom factor indicates a high zoom ratio, the camera module 1100b may operate as a master and the camera module 1100a may operate as a slave.

In some example embodiments, a control signal provided from the camera module controller 1216 to each of the camera modules 1100a, 1100b, and 1100c may include a sync enable signal. For example, when the camera module 1100b is a master camera module and the camera module 1100a is a slave camera module, the camera module controller 1216 may transmit the sync enable signal to the camera module 1100b. When the camera module 1100b receives the sync enable signal, the camera module 1100b may generate a sync signal based on the sync enable signal and may provide the sync signal to the camera modules 1100a and 1100c through a sync signal line SSL. The camera modules 1100a, 1100b, and 1100c may be synchronized with the sync signal and may transmit image data to the application processor 1200.

In some example embodiments, a control signal provided from the camera module controller 1216 to each of the camera modules 1100a, 1100b, and 1100c may include mode information according to a mode signal. The camera modules 1100a, 1100b, and 1100c may operate in a first operation mode or a second operation mode in relation with a sensing speed based on the mode information.

In the first operation mode, the camera modules 1100a, 1100b, and 1100c may generate an image signal at a first speed (for example, at a first frame rate), encode the image signal at a second speed greater than the first speed (for example, at a second frame rate greater than the first frame rate), and transmit the encoded image signal to the application processor 1200. In this case, the second speed may be 30 times greater than or less than 30 time greater than the first speed.

The application processor 1200 may store the received image signal, that is, the encoded image signal, in the internal memory 1230 or the external memory 1400 provided outside the application processor 1200. Thereafter, the application processor 1200 may read the encoded image signal from the internal memory 1230 or the external memory 1400, decode the encoded image signal, and display image data generated based on the decoded image signal. For example, a corresponding one of the sub-image processors 1212a, 1212b, and 1212c of the image processing unit 1210 may decode the encoded image signal and may also perform image processing on the decoded image signal.

In the second operation mode, the camera modules 1100a, 1100b, and 1100c may generate an image signal at a third speed less than the first speed (for example, at a third frame rate less than the first frame rate) and may transmit the image signal to the application processor 1200. The image signal provided to the application processor 1200 may be a non-encoded image signal. The application processor 1200 may perform image processing on the image signal or store the image signal in the internal memory 1230 or the external memory 1400.

The PMIC 1300 may provide power, for example, power supply voltage, to each of the camera modules 1100*a*, 1100*b*, and 1100*c*. For example, under control by the application processor 1200, the PMIC 1300 may provide a first piece of power to the camera module 1100*a* through a power signal line PSLa, a second piece of power to the camera module 1100*b* through a power signal line PSLb, and a third piece of power to the camera module 1100*c* through a power signal line PSLc.

The PMIC 1300 may generate power corresponding to each of the camera modules 1100*a*, 1100*b*, and 1100*c* and adjust the level of the power, in response to a power control signal PCON received from the application processor 1200. The power control signal PCON may include a power adjustment signal for each operation mode of the camera modules 1100*a*, 1100*b*, and 1100*c*. For example, the operation mode may include a low-power mode. In this case, the power control signal PCON may include information about a camera module to be operated in the low-power mode and information on a set power level. The same level or different levels of power may be provided to the camera modules 1100*a*, 1100*b*, and 1100*c*. In addition, the level of power may be dynamically varied.

While inventive concepts have been particularly shown and described with reference to example embodiments thereof, it will be understood that various changes in form and details may be made therein without departing from the spirit and scope of the following claims. Furthermore, example embodiments are not necessarily mutually exclusive with one another. For example, some example embodiments may include one or more features described with reference to one or more figures, and may also include one or more other features described with reference to one or more other figures.

What is claimed is:

1. An image sensor comprising:
a first photodiode on a first pixel region in a plan view;
a second photodiode on a second pixel region in the plan view adjacent to the first photodiode and having a smaller light-receiving area than a light-receiving area of the first photodiode in the plan view;
a first transfer transistor between the first photodiode and a first floating diffusion node;
a second transfer transistor between the second photodiode and a second floating diffusion node;
a first reset transistor connected to the first floating diffusion node;
a capacitor connected to a first power supply voltage;
a first conversion gain transistor between the capacitor and the second floating diffusion node;
a second reset transistor connected to the capacitor and the second floating diffusion node; and
a driving transistor connected to the first floating diffusion node.

2. The image sensor of claim 1, further comprising a second conversion gain transistor between the first floating diffusion node and the first reset transistor.

3. The image sensor of claim 2, wherein the first transfer transistor and the driving transistor are disposed on the first pixel region on the plan view, and wherein the second transfer transistor and the first conversion gain transistor are disposed on the second pixel region on the plan view.

4. The image sensor of claim 3, further comprising a device isolation layer between the first photodiode and the second photodiode.

5. The image sensor of claim 4, further comprising a selection transistor connected to the driving transistor,
wherein the first pixel region and the second pixel region are disposed in a first direction in the plan view,
wherein the driving transistor and the selection transistor are disposed in a second direction in the plan view, and
wherein the first direction is neither parallel nor perpendicular to the second direction in the plan view.

6. The image sensor of claim 5, wherein the driving transistor is connected to a second power supply voltage different from the first power supply voltage.

7. The image sensor of claim 5, further comprising a switch transistor between the second floating diffusion node and a third floating diffusion node, and
wherein the third floating diffusion node is disposed between the first reset transistor and the second conversion gain transistor.

8. The image sensor of claim 5, further comprising a switch transistor between the second floating diffusion node and the first floating diffusion node.

9. An image sensor comprising:
a pixel configured to output a pixel signal through a first column line, the pixel including,
a first photodiode provided in a first pixel region;
a second photodiode provided in a second pixel region, the second pixel region having an area smaller than an area of the first pixel region and provided adjacent to the first pixel region;
a first reset transistor provided in the first pixel region, the first reset transistor having a first end connected to a reset power supply voltage and configured to reset a first floating diffusion node;
a first driving transistor provided in the first pixel region and having a gate connected to the first floating diffusion node;
a first selection transistor provided in the first pixel region and having a first end connected to the first driving transistor;
a second reset transistor having a first end connected to the reset power supply voltage and configured to reset a second floating diffusion node;
a second driving transistor provided in the first pixel region and having a gate connected to the second floating diffusion node; and
a second selection transistor provided in the first pixel region and having a first end connected to the second driving transistor,
wherein a second end of the first selection transistor and a second end of the second selection transistor are connected to the first column line.

10. The image sensor of claim 9, wherein the first floating diffusion node and the second floating diffusion node are reset with the reset power supply voltage.

11. The image sensor of claim 10, wherein an operating range of the first driving transistor is different from an operating range of the second driving transistor.

12. The image sensor of claim 11, wherein a threshold voltage of the first driving transistor is less than a threshold voltage of the second driving transistor.

13. The image sensor of claim 10, wherein a channel width of the first driving transistor is greater than a channel width of the second driving transistor.

14. The image sensor of claim 10, wherein a value obtained by dividing a channel width of the first driving transistor by a channel length of the first driving transistor is greater than a value obtained by dividing a channel width of the second driving transistor by a channel length of the second driving transistor.

15. The image sensor of claim 14, wherein the pixel further includes, a first conversion gain transistor having a first end connected to the first floating diffusion node and a second end connected to the first reset transistor, and the first conversion gain transistor is provided in the first pixel region.

16. The image sensor of claim 15, wherein the pixel further includes, a second conversion gain transistor having a first end connected to the second floating diffusion node; and a capacitor having a first end connected to the second conversion gain transistor.

17. The image sensor of claim 16, wherein the second reset transistor, the second conversion gain transistor, and the capacitor are provided in the first pixel region.

18. An image sensor comprising:

a pixel configured to output pixel signals through a first column line and a second column line, the pixel including, a first photodiode provided in a first pixel region;

a second photodiode provided in a second pixel region, the second pixel region having an area smaller than an area of the first pixel region and provided adjacent to the first pixel region;

a first reset transistor provided in the first pixel region, the first reset transistor having a first end connected to a reset power supply voltage and configured to reset a first floating diffusion node with the reset power supply voltage;

a first transfer transistor provided in the first pixel region, the first transfer transistor having a first end connected to the first photodiode and a second end connected to the first floating diffusion node;

a first driving transistor provided in the first pixel region and having a gate connected to the first floating diffusion node;

a first selection transistor provided in the first pixel region and having a first end connected to the first driving transistor;

a second driving transistor provided in the first pixel region and having a gate connected to a second floating diffusion node;

a second selection transistor provided in the first pixel region and having a first end connected to the second driving transistor;

a second transfer transistor provided in the second pixel region, the second transfer transistor having a first end connected to the second photodiode and a second end connected to the second floating diffusion node; and a second reset transistor having a first end connected to the reset power supply voltage and configured to reset the second floating diffusion node with the reset power supply voltage, wherein a second end of the first selection transistor is connected to the first column line, and a second end of the second selection transistor is connected to the second column line.

19. The image sensor of claim 18, wherein the first floating diffusion node and the second floating diffusion node are reset by the reset power supply voltage, and a threshold voltage of the first driving transistor is less than a threshold voltage of the second driving transistor.

20. The image sensor of claim 19, wherein a value obtained by dividing a channel width of the first driving transistor by a channel length of the first driving transistor is greater than a value obtained by dividing a channel width of the second driving transistor by a channel length of the second driving transistor.

* * * * *